United States Patent
Chabinyc et al.

(10) Patent No.: US 7,786,430 B2
(45) Date of Patent: Aug. 31, 2010

(54) PRODUCING LAYERED STRUCTURES WITH LAYERS THAT TRANSPORT CHARGE CARRIERS

(75) Inventors: Michael L. Chabinyc, San Francisco, CA (US); Tse Nga Ng, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/482,610

(22) Filed: Jun. 11, 2009

(65) Prior Publication Data
US 2009/0243020 A1 Oct. 1, 2009

Related U.S. Application Data

(62) Division of application No. 11/959,901, filed on Dec. 19, 2007, now Pat. No. 7,586,080.

(51) Int. Cl.
*H01J 5/02* (2006.01)
(52) U.S. Cl. .................... 250/239; 250/214 R
(58) Field of Classification Search ............. 250/214 R, 250/239, 208.1, 214.1, 214 LA; 257/290–294, 257/321–324, 184–258; 348/311–314, 243; 430/58.01–58.05, 56, 59.1; 438/69, 82, 257
See application file for complete search history.

(56) References Cited

U.S. PATENT DOCUMENTS

| | | | |
|---|---|---|---|
| 5,517,031 A | 5/1996 | Wei et al. | |
| 6,297,495 B1 | 10/2001 | Bulovic et al. | |
| 6,300,612 B1 | 10/2001 | Yu | |
| 6,804,149 B2 * | 10/2004 | Ogura et al. | 365/185.18 |
| 6,806,473 B2 | 10/2004 | Honda et al. | |
| 6,921,679 B2 | 7/2005 | Chabinyc et al. | |
| 7,586,080 B2 | 9/2009 | Chabinyc et al. | |
| 2004/0041097 A1 | 3/2004 | Ishii et al. | |
| 2007/0158644 A1 | 7/2007 | Chabinyc et al. | |
| 2009/0108304 A1 | 4/2009 | Ng et al. | |

(Continued)

OTHER PUBLICATIONS

Notice of Allowance and Fee(s) Due in U.S. Appl. No. 11/959,901, mailed May 13, 2009, 12 pages, published in PAIR.

(Continued)

*Primary Examiner*—Que T Le
(74) *Attorney, Agent, or Firm*—Mark W. Hrozenchik; Leading-Edge Law Group, PLC

(57) ABSTRACT

Layered structures such as photosensing arrays include layers in which charge carriers can be transported. For example, a carrier-transporting substructure that includes a solution processing artifact can transport charge carriers that flow to or from it through charge-flow surface parts that are on electrically conductive regions of a circuitry substructure; the circuitry substructure can also have channel surface parts that are on semiconductive channel regions, with a set of the channel regions operating as acceptable switches in an application. Or a first substructure's surface can have carrier-active surface parts on electrode regions and line surface parts on line regions; a second substructure can include a transport layer on carrier-active surface parts and, over it, an electrically conductive layer; to prevent leakage, an open region can be defined in the electrically conductive layer over the line surface part and/or an electrically insulating layer portion can cover the line surface part.

9 Claims, 13 Drawing Sheets

U.S. PATENT DOCUMENTS

| | | |
|---|---|---|
| 2009/0152534 A1 | 6/2009 | Chabinyc et al. |
| 2009/0159781 A1 | 6/2009 | Chabinyc et al. |
| 2009/0159875 A1 | 6/2009 | Chabinyc et al. |

OTHER PUBLICATIONS

Office communication in U.S. Appl. No. 11/960,874, mailed Mar. 4, 2010, 15 pages, published in PAIR.

McCulloch, I., Heeney, M., Bailey, C., Genevicius, K., MacDonald, I., Shkunov, M., Sparrowe, D., Tierney, S., Wagner, R., Zhang, W., Chabinyc, M.L., Kline, R.J., McGehee, M.D., and Toney, M.F., "Liquid-crystalline semiconducting polymers with high charge-carrier mobility", nature materials, vol. 5, Apr. 2006, pp. 328-333.

Chabinyc, M., "Controlling the performance of semiconducting polymers for printed electronics", 2007 MRS Spring Meeting, Apr. 9-13, 2007, San Francisco, California, Abstract, 1 page.

McCulloch, I., Bailey, C., Heeney, M., Shkunov, M., Sparrowe, D., Tierney, S., Chabinyc, M., Kline, J., The development of pBTTT, 2007 MRS Spring Meeting, Apr. 9-13, 2007, San Francisco, California, Abstract, 1 page.

Notice of Allowance and Fee(s) Due in U.S. Appl. No. 11/959,901, mailed May 13, 2009, 12 pages.

Office communication in U.S. Appl. No. 11/960,874, mailed Oct. 28, 2009, 20 pages, published in PAIR.

Amendment in U.S. Appl. No. 11/960,874, submitted Dec. 14, 2009, 21 pages, published in PAIR.

Office communication in U.S. Appl. No. 11/959,187, mailed Oct. 15, 2009, 13 pages, published in PAIR.

Amendment Submitting Terminal Disclaimer in U.S. Appl. No. 11/959,187, submitted Nov. 4, 2009, 20 pages, published in PAIR.

Office communication in U.S. Appl. No. 11/959,187, mailed on Mar. 5, 2010, 9 pages, published in PAIR.

Office communication in U.S. Appl. No. 11/959,187, mailed on Apr. 1, 2010, 6 pages, published in PAIR.

Amendment in U.S. Appl. No. 11/960,874, submitted on Apr. 23, 2010, 18 pages, published in PAIR.

Office communication in U.S. Appl. No. 11/960,874, mailed on May 10, 2010, 3 pages, published in PAIR.

* cited by examiner

PRODUCING LAYERED STRUCTURES WITH LAYERS THAT TRANSPORT CHARGE CARRIERS

This application claims priority as a divisional of co-pending U.S. patent application Ser. No. 11/959,901, entitled "Producing Layered Structures with Layers That Transport Charge Carriers," incorporated herein by reference in its entirety.

BACKGROUND OF THE INVENTION

The present invention relates generally to production of layered structures with layers in which charge carriers are transported. For example, the layered structures can be light-interactive devices such as photosensing arrays.

A multitude of layered structures with charge carrier transport layers have been proposed for various uses. For example, several techniques have been proposed for photosensing applications.

Someya, T., Kato, Y., Iba, S., Noguchi, Y., Sekitani, T., Kawaguchi, H., and Sakurai, T., "Integration of Organic FETs With Organic Photodiodes for a Large Area, Flexible, and Lightweight Sheet Image Scanners", *IEEE Transactions on Electron Devices*, Vol. 52, No. 11, November 2005, pp. 2502-2511, describe a manufacturing process for image scanners in which an organic FET matrix and a photodiode matrix are manufactured separately on different plastic films and then laminated with each other using a silver paste patterned by a microdispenser or using anisotropic conductive films. The photodiode matrix includes a layer of p-type semiconductor of copper phthalocyanine and a layer of n-type semiconductor of 3,4,9,10-perylene-tetracarboxylic-diimide (PTCDI), and photoresponse is limited by transport of photogenerated carriers in organic layers.

Street, R. A., Graham, J., Popovic, Z. D., Hor, A., Ready, S., and Ho, J., "Image sensors combining an organic photoconductor with a-Si:H matrix addressing", *Journal of Non-Crystalline Solids*, 2002, pp. 1240-1244, describe bi-layer sensors include a generator layer deposited first and then overcoated with a transparent hole transport layer. The generator layer could be benzimidazole perylene (BZP) deposited by vacuum evaporation; a hydroxyl gallium phthalocyanine (HO-GaPc) dispersion in VMCH, deposited by dip-coating; or a titanyl phthalocyanine (TiOPc) dispersion in BM-S, deposited by dip-coating. The transport layer could be tetraphenyldiamine (TPD) in a binder, deposited by blade-coating or dip-coating. Amorphous silicon TFTs are used for addressing, but future devices might use organic TFTs.

U.S. Pat. No. 7,056,632 describes an organic optoelectronic device that includes a solution coatable thin film having a hole transporting material, an electron transporting material, and a photogenerating component uniformly dispersed in it.

It would be advantageous to have improved techniques for layered structure in which layers transport charge carriers.

SUMMARY OF THE INVENTION

The invention provides various exemplary embodiments, including structures, devices, arrays, and methods. In general, the embodiments are implemented with layered structures in which charge carriers are transported.

These and other features and advantages of exemplary embodiments of the invention are described below with reference to the accompanying drawings.

DETAILED DESCRIPTION

Figure 1:
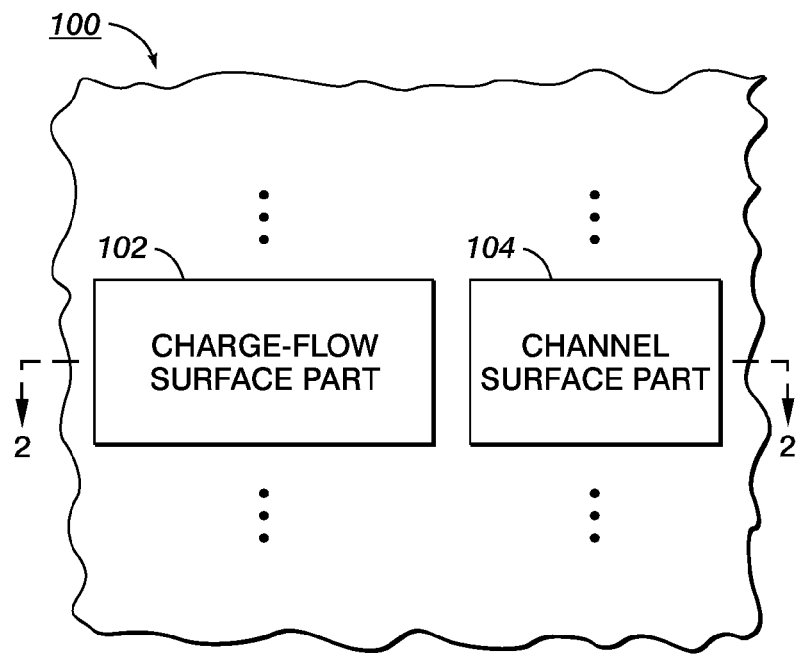
FIG. 1 is a schematic top view of a fragment of a layered structure in which a substructure has charge-flow surface parts and channel surface parts.

In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the claims. In the description and the claims, the words "a" or "an" include any number greater than or equal to one.

Many electronic parts, components, and devices can be implemented with layered structures, i.e. structures that include layers. Such structures typically include layers or parts of layers that are electrically conductive and other layers or parts of layers that are electrically insulating. Still other layers or parts of layers are "semiconductive", meaning that they can be either electrically insulating or electrically conductive, depending on one or more conditions or stimuli that can change without departing from applicable normal operating conditions. Electrically conductive, electrically insulating (e.g. dielectric), and semiconductive layers or parts of layers can each be implemented with a wide variety of materials in a wide variety of geometries; regardless of the materials and geometry, a part of a layer that has a certain characteristic and that extends in three dimensions is sometimes referred to herein as a "region", a "subregion", or a "portion" of a layer, region, or subregion.

The exemplary implementations described below address problems that arise with layered structures that include electrically conductive and/or semiconductive material. Some of the problems arise, for example, in layered structures that include two or more different types of regions or subregions. Some problems are specific to layered structures in which interactions with light can occur; for example, several of the exemplary implementations address problems that arise in aligning thin-film transistors with other parts of such structures, instead providing one or more layers that need not be patterned or aligned but through which charge carriers can be transported—such a layer is sometimes referred to herein as a "blanket" layer or sublayer, especially where it is completely unpatterned. Some exemplary implementations provide, for example, an anisotropic blanket transport layer.

Some problems arise when different types of regions or subregions in a substructure have different types of surface parts that are disposed toward a layer in which charge carriers are transported, such as a layer that is a source or destination of charge carriers. In many typical electronic structures, one type of surface part should not interact with charge carriers that are being transported because that could adversely affect operation, but another type of surface part should interact with charge carriers during normal operation.

In one example, surface parts of one type are on semiconductive channel regions, such as in transistors, while surface parts of another type receive or provide charge carriers, such as from or to another substructure; the other substructure could, for example, transport charge carriers in a thickness direction, such as in response to incident light. In this case, additional measures may be needed so that switching operation of semiconductive channel regions is not adversely affected by the other substructure. The additional measures are typically complicated and expensive, require more complexity in resulting layered structures, and tend to increase the failure rate of layered structures being produced.

In another example, surface parts of one type are on electrically conductive line regions, such as data lines in an array, while surface parts of another type interact with charge carriers, such as by receiving charge carriers from or by providing charge carriers to a transport layer over which is an upper layer that is electrically conductive, such as a top electrode. In this case, if charge carriers are transported through the transport layer between the upper layer and the line regions, electrical signals in the line regions will be affected, possibly interfering with operation of the layered structure.

The exemplary implementations described below include various features that address these and related problems.

In general, the implementations involve structures, articles, or parts or components of structures or articles that are connected in some way. For example, structures, articles, or parts or components of structures or articles may sometimes be referred to as "attached" to each other or to other structures, articles, parts, or components or vice versa, and operations are performed that "attach" structures, articles, or parts or components of structures or articles to each other or to other things or visa versa; the terms "attached", "attach", and related terms refer to any type of connecting that could be performed in the context. One type of attaching is "mounting", which occurs when a first part or component is attached to a second part or component that functions as a support for the first. In contrast, the more generic term "connecting" includes not only "attaching" and "mounting", but also integrally forming a structure or a structure's components or parts and making other types of connections such as electrical connections between or among devices or components of circuitry. A combination of one or more parts connected in any way is sometimes referred to herein as a "structure"; a structure may include one or more structures within it, sometimes referred to herein as "substructures".

Two or more parts or components of a structure are "electrically connected" when electrical current meeting an appropriate criterion can flow between them under conditions that normally apply during use or operation of the structure. An appropriate criterion would, for example, distinguish between electrical current that can carry signals on the one hand and electrical current that can carry only noise; "parasitic" or "leakage" current is one type of noise-only current that can occur in many structures due, for example, to defects, design limitations, or fundamental physical limits. Parts or components can be electrically connected in many ways, including, for example, through direct electrical connection or through other parts or components that are electrically conductive.

An "electronic component" or simply "component" is a part within which, in operation, movement of charge carriers occurs, such as movement of electrons or holes. Unless the context indicates otherwise, the terms "circuitry" and "circuit" are used herein to refer to structures in which one or more electronic components have sufficient electrical connections to operate together or in a related manner. In some instances, an item of circuitry can include more than one circuit.

A "lead" is a part of a component at which the component is electrically connected to one or more other components, while a "line" is a simple electrically conductive component, typically extending between and electrically connecting two or more leads or other electrical connection points; a line could, for example, carry electrical signals, such as a data line in an array. A "channel" is a part of a component through which electrical current can flow by movement of charge carriers. A channel typically extends between two ends, sometimes referred to as "channel ends", and leads through which channel ends are electrically connected to other components are sometimes referred to herein as "channel leads". A channel is "conductive" when it is in a state in which current can flow through it.

A "transistor" is a component that has a channel that extends between two channel leads, and that also has a third lead—referred to as a "gate lead" or simply "gate"—such that the channel can be switched or otherwise controlled between high and low impedance by electrical signals that change potential difference between the gate and one of the channel leads. If a transistor is structured or connected so that the channel's conductivity is always controlled by the potential difference between the gate and the same one of the channel leads, that channel lead is referred to as the "source", while the other channel lead is referred to as the "drain". Other components may have leads called gates, sources, drains, and so forth by analogy to transistors.

Some of the components described herein employ structures with one or more dimensions smaller than 1 mm, and various techniques have been proposed for producing such structures. In particular, some techniques for producing such structures are referred to as "microfabrication." Examples of microfabrication include various techniques for depositing materials such as growth of epitaxial material, sputter deposition, evaporation techniques, plating techniques, spin coating, printing, and other such techniques; techniques for patterning materials, such as etching or otherwise removing exposed regions of thin films through a photolithographically patterned resist layer or other patterned layer; techniques for polishing, planarizing, or otherwise modifying exposed surfaces of materials; and so forth.

In general, some of the structures, elements, and components described herein are supported on a "support structure" or "support surface", which terms are used herein to mean a structure or a structure's surface that can support other structures. More specifically, a support structure could be a "substrate", used herein to mean a support structure on a surface of which other structures can be formed or attached by microfabrication or similar process.

As used herein, a "layer" is a thickness of material, whether or not patterned in any way. A layer "includes" a specified type of material if material of the specified type is present in any part of the layer; a layer is "of" a specified type of material if material of the specified type is predominant throughout the layer. A layer may be homogeneous or its composition or characteristics may vary. A layer may include two or more layers or parts of layers within it, sometimes referred to as "sublayers".

As mentioned above, a "layered structure" refers herein to a structure that includes layers, such as microfabricated or thin film layers. A layered structure can be on a substrate or other support structure; a substrate can itself be one of the layers in a layered structure, and the substrate may in turn include layers within its structure. More generally, a layer can be or include a layered structure.

An "integrated structure", "integrated circuit", or "IC" is a structure with electronic components and connections produced by microfabrication or similar processes. Implementations of ICs described herein include features characterized as "cells" (or "elements") and "arrays", terms that are used with related meanings: An "array" is an arrangement of "cells" or "elements"; unless otherwise indicated by the context, the words "cell" and "element" are used interchangeably herein to mean a cell or an element of an array. In a layered structure that is an array, each cell's portion of the layered structure is sometimes referred to herein as a "cell region". An IC that includes an array can also include "peripheral circuitry", meaning circuitry outside the array, in contrast with "external circuitry", meaning circuitry that is not only outside the array but also not on the same IC with the array.

"Light" refers herein to electromagnetic radiation of any wavelength or frequency. The term "sensing" is used herein in the most generic sense of obtaining information from a physical stimulus; sensing therefore includes actions such as detecting, measuring, and so forth. To "photosense" is to sense light. Light that is photosensed or otherwise received by an electronic component is sometimes referred to herein as "incident light". An IC with an array of cells, at least some of which perform photosensing, is sometimes referred to herein as a "photosensing array". A "photoconductive" material, or simply a "photoconductor", is a material that generates free charge carrier, such as free electron-hole pairs, in response to incident light; photoconductive materials can be used in producing various kinds of photosensors.

An "electrode" is a conductive part or component of an electronic device; although the term "electrode" is usually used for a part or component that operates in some way other than solely as a line, an electrode could be part of a line. Various electrodes can, for example, operate as gate, source, and drain of transistor structures, as plates of capacitive components, as contact pads, and so forth. As used herein, a "cell electrode" is an electrode within a cell region, typically within an active circuitry layer of the cell region.

A structure may be described by its operation, such as a "carrier-transporting" structure or substructure in an electronic component, meaning a layered structure within which charge carriers are transported during operation of the component. Also, an "active layered" structure or substructure in an electronic component means a layered structure within which charge carriers move to store or transfer information during operation of the component, such as in operations that accumulate or store charge or provide or receive electrical signals; an active layered structure or substructure could, for example, include channels of one or more transistors. In addition, a structure may be characterized by the nature of its parts or the way in which they are connected, such as a "circuitry substructure" in which parts are connected into circuitry; an "array structure", meaning a structure such as an IC that includes an array; or a "layered array structure", meaning a layered structure that is also an array structure.

Similarly, a layer, region, subregion, or portion may be described by its operation, such as an "active circuitry layer", meaning a layer within which charge carriers move to store or transfer information during operation, such as in operations that accumulate or store charge or provide or receive electrical signals; an active circuitry layer could include channels of one or more transistors, for example. Also, a "top electrode layer" is typically used herein to mean a layer that is not an active circuitry layer but that includes electrodes that can operate as top electrodes for cells of an array; as used herein, a "top electrode" need not be on top of an array or over or above the array, but is typically separated from an array by one or more other layers that are neither electrode layers nor active circuitry layers. More generally, an "electrically conductive electrode" region or portion is used herein to refer to a region or portion that is part or all of an electrode, and an "electrically conductive line" region or portion is used herein to refer to a region or portion that is part or all of an electrically conductive line, with a "data line portion" more specifically being a line portion that operates as part of a data line in operation. A "channel region" is a region that can operate as a channel, such as a channel of a transistor.

In addition, a layer or region, subregion, or portion of a layer may be characterized by the material it contains, a description of its conductivity, or another characteristic of its structure: Exemplary terms include "electrically conductive" layer, region, or portion, i.e. a region or portion that is electrically conductive; "semiconductive" region or portion, meaning a region or portion that is semiconductive; an "electrically insulating layer portion", meaning a portion of an electrically insulating layer; and an "open region" meaning a region defined in a layer or portion of a layer in which the layer's material is not present.

Top electrodes in arrays provide a directional orientation as follows: A direction away from a top electrode toward an active circuitry layer is "down", "under", or "below", while a direction from an active circuitry layer toward a top electrode is "up", "over", or "above". The terms "upper" and "top" are typically applied to structures, components, or surfaces disposed toward, at, or above a top electrode, while "lower" or "underlying" are applied to structures, components, or surfaces disposed toward, at, or below an active circuitry layer. In general, it should be understood that the above directional orientation is arbitrary and only for ease of description, and that an array may have any appropriate orientation. Also, a similar orientation could be applied by analogy to a structure that does not include a top electrode or to an incomplete structure to which a top electrode has not yet been attached.

A structure or component is "directly on" or sometimes simply "on" a surface when it is both over and in contact with the surface; more generally, two surfaces "meet each other" or simply "meet" when they are in contact in the same way they would be if one were directly on the other. Similarly, a layer, region, subregion, or portion "covers" another part or component if the layer, region, subregion, or portion is on substantially all of an upper surface of the part or component. A structure is "fabricated on" a surface when the structure was produced on or over the surface by microfabrication or similar processes. A process that produces a layer or other accumulation of material over or directly on a surface, such as a substrate's surface, can be said to "deposit" the material.

Where an upper layer, region, subregion, or portion is generally above a lower part or component but not over it, the upper layer, region, subregion or portion may be referred to as "not extending over" the lower part or component. When the upper layer, region, subregion, or portion "does not extend substantially over" the lower part or component, the upper layer, region, subregion, or portion is over only an insubstantial or negligible part of the lower part or component, such as less than one tenth of its width if it is a line or a line surface part.

A surface is "on" a layer or layer part such as a region or subregion, or the layer or layer part "has" a surface, if the surface is an exterior surface of the layer or layer part such as an exposed surface or a surface at which it meets another layer or layer part. Similarly, a surface is "on" a layered structure or substructure, or the structure or substructure "has" a surface, if the surface is an exterior surface of the layered structure or substructure such as an exposed surface or a surface at which it meets another structure or substructure. Conversely, a layer is deposited or otherwise produced "on" a structure or substructure if, after its production, the layer is on a surface that was previously an external surface of the structure or substructure; after production, such a layer may be described herein as included in the structure or substructure on which it was produced.

Like a layer, a surface or surface part may be described by its operation, such as a "carrier-active surface part", meaning a part of a surface through or at which interaction with charge carriers occurs in operation, such as flow of charge carriers through the surface or generation or recombination of charge carriers at the surface; an "charge-flow surface part", meaning a carrier-active surface part through which charge carriers flow during operation, such as to or from another surface that meets the charge-flow surface part; a "channel surface part", meaning a part of a surface that is on or bounds a channel region, such as a channel of a transistor structure; and a "line surface part", meaning a part of a surface that is on or bounds an electrically conductive line. In addition, a surface or surface part may be characterized by the material it contains, a description of its conductivity, or another characteristic of its structure; for example, a "patterned surface" is a surface that has parts in a pattern, such as due to microfabrication, printing, or other similar patterning processes.

Some of the exemplary implementations described below include a "laminating" or "lamination" operation, meaning an operation that occurs in producing a layered structure and that attaches two or more previously existing substructures, with each pair of adjacent substructures having surfaces that meet each other; after a laminating or lamination operation, the substructures are referred to as "laminated". In a typical implementation, each laminated substructure is also a layered structure produced, for example, by microfabrication, lamination, or similar operations.

Figure 2:
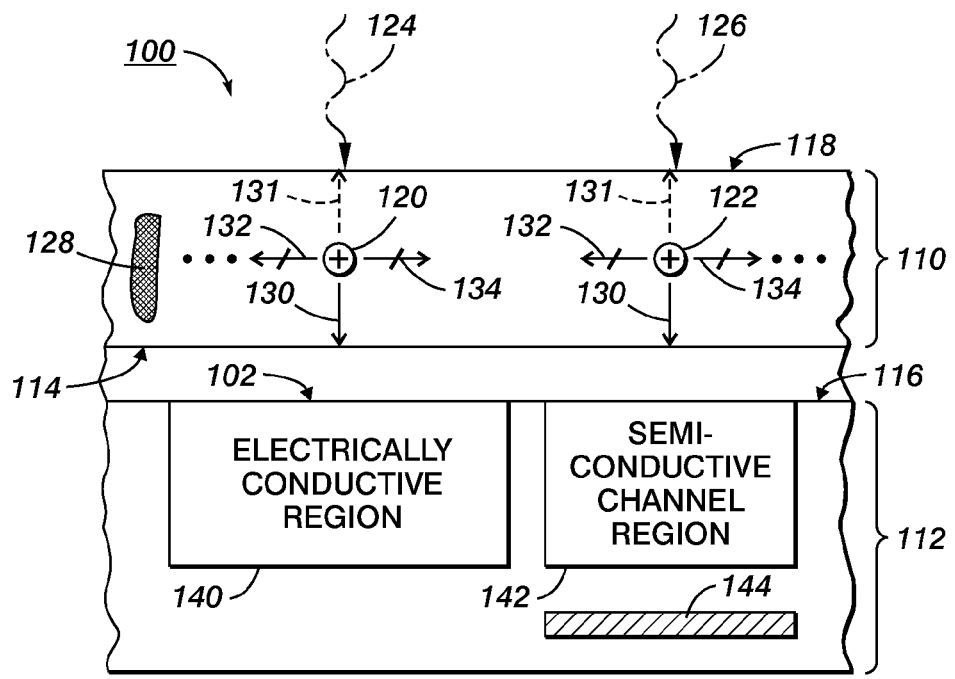
FIG. 2 is a schematic cross section of a fragment as in FIG. 1, taken along the line 2-2 in FIG. 1.

FIGS. 1 and 2 show an example of a layered structure that includes a substructure with two different types of surface parts on two different types of regions. Structure fragment 100 includes one or more charge-flow surface parts, with surface part 102 being a representative example, as suggested by the ellipses above and below it. Similarly, structure fragment 100 includes one or more channel surface parts, with surface part 104 being a representative example, as suggested by the ellipses above and below it.

The cross-section of fragment 100 in FIG. 2 shows two substructures, carrier-transporting substructure 110 and circuitry substructure 112, with respective surfaces 114 and 116 disposed toward each other and with substructure 110 also having surface 118 disposed away from substructure 112; where surfaces are disposed toward each other, as surfaces 114 and 116 are in FIG. 2, one or both of them may be referred to as a "facing surface". Although surfaces 114 and 116 are shown slightly separated for illustratively purposes, they could meet, as in some exemplary implementations described below; also, rather than being approximately flat as shown, surfaces 114 and 116 could each depart from flatness, as in some of the exemplary implementations. Even if they depart from flatness, however, each of surfaces 114 and 116 extends "approximately perpendicularly" to a thickness direction of its structure or substructure, meaning that most of its area is closer to being perpendicular to the thickness direction than to being parallel to it, even though such a surface can locally include a relatively small area that is closer to being parallel to the thickness direction, as illustrated in some of the exemplary implementations described below.

In operation, substructure 110 transports charge carriers, illustratively shown by holes 120 and 122; a carrier-transporting substructure could transport other types of charge carriers such as electrons, for example, depending on materials in the substructure. In the illustrated example, holes 120 and 122 are transported to surface 114, which operates as an output surface for substructure 110, but the direction of transport could instead be toward surface 118 which could also operate as an output surface, providing charge carriers to a top electrode or other conductive component (not shown). In general, direction of charge carrier transport depends on orientation of electric field, sign of charge carriers, and properties of material in substructure 110. A net current can flow across substructure 110, such as due to charge injection at the surface opposite an output surface at which charge carriers are provided.

As suggested by rays 124 and 126 incident on substructure 110, holes 120 and 122 are transported to one of surfaces 114 and 118 in response to incident light.

As represented schematically in FIG. 2 by artifact 128, substructure 110 includes one or more layers or sublayers of material that include "solution processing artifacts", a term that refers herein to artifacts that are produced when material is deposited by solution processing. As used herein, the term "solution processing" includes any of a variety of processing techniques in which coatings, films, or other layers are produced, not by melt processing or the like, but by using a solution of material in a solvent; solution processing therefore typically includes drying or removal of solvent from a solution.

Several types of solution processing artifacts can often be detected by visually examining a line profile of a layer produced by solution processing, such as with appropriate magnification; examples include coffee drop patterns analogous to those produced by an evaporating droplet, which can arise with various solution processing techniques, and streaking, likely to arise due to spin-casting. In addition, another type of solution processing artifact is a layer of material that could only be feasibly deposited by solution processing at the time it was deposited.

Examples of materials that can be used in solution processing include polymer material or blends of polymers and small molecules or other polymers (e.g. a tetraphenylenediamine in polycarbonate); examples of polymers that can be used in solution processing include "organic polymer", referring herein to any material that includes polymerized organic compounds, such as poly(3-hexylthiophene) or poly[(2-alkoxy,5-alkoxy)-1,4-phenylene vinylene]; other examples of materials that can be used in solution processing include inorganic materials such as amorphous silicon or colloidal particles such as nanoparticles of PbS or PbSe, i.e. particles with diameter not greater than approximately 100 nm. As used herein, the more general terms "polymer" and "polymer material" include not only any organic polymer as defined above but also any "inorganic polymer", i.e. a material that contains a backbone of polymerized inorganic compounds, e.g. a polysilane, whether or not it can be used in solution processing.

In operation, substructure 110 transports charge carriers such as holes anisotropically, as illustrated by arrows 130, 131, 132, and 134 in FIG. 2; as used herein, charge carriers are transported "anisotropically" if they are transported at different speeds in different directions. For example, arrows 130 indicate that holes 120 and 122 are transported at a relatively high speed toward surface 114, and dashed arrows 131 similarly indicate that holes 120 and 122 could alternatively be transported at a relatively high speed toward surface 118; crossed arrows 132 and 134, on the other hand, indicate that holes 120 and 122 are transported at relatively low speeds or not at all in leftward and rightward directions, respectively, parallel to surfaces 114 and 118. More specifically, transport in directions parallel to surfaces 114 and 118 is "negligible", meaning that if a charge carrier's net resultant transport were analyzed into vectors perpendicular and parallel to surface 114, the parallel vector's magnitude is a small fraction of the perpendicular vector's magnitude, such as approximately $\frac{1}{100}$ or less.

In a structure as in FIGS. 1 and 2, directions that are approximately perpendicular to surface 114 or surface 118 are sometimes referred to as "thickness directions", while directions that are approximately parallel to surface 114 or surface 118 (and therefore approximately perpendicular to thickness directions) are sometimes referred to as "lateral directions". Using this terminology, a layer, structure, or substructure transports charge carriers "in a thickness direction anisotropically" if transport in the thickness direction is relatively high compared with transport in directions perpendicular to the thickness direction, which might be negligible. Various techniques could be used to measure carrier mobility in lateral directions and in thickness directions in a given carrier-providing substructure, and it is foreseeable that additional mobility measuring techniques will be discovered, so that the scope of meaning of "negligible transport" and related terms are not limited to measurements made in ways currently known.

In substructure 112, surface part 102 is on electrically conductive region 140, while surface part 104 is on semiconductive channel region 142. An additional feature is suggested by gate part 144, an electrically conductive part that could be in any suitable position in the layered structure and that controls the conductivity of channel region 142; more specifically, region 142 is one of a set of semiconductive channel regions in the layered structure, each of which, in response to a respective gate part, operates as an acceptable switch between conductive and nonconductive states for a given application.

The term "acceptable switch", as used herein, refers to a channel region, subregion, or other part that that satisfies a switching criterion appropriate to a given application. In other words, an acceptable switch must be switchable between conductive and nonconductive states in response to gate voltages available in the application and must have sufficiently great conductivity in the conductive state and sufficiently low leakage current in the nonconductive state to satisfy the application's requirements. For example, in a photosensing array or another application in which an array of cells each includes a capacitive component that stores a signal level, an acceptable switch must be switchable between a conductive state in which the signal level can be stored or read out in the time available and a nonconductive state in which the signal level can be stored sufficiently long for proper operation. Minimum requirements for an acceptable switch for a given application can, for example, be specified by a maximum switching time, a minimum conductivity when ON, and a maximum current level when OFF. Specific ways in which acceptable switches can be implemented are illustrated in relation to some of the exemplary implementations described below.

Gate part 144 and similar parts or components In exemplary implementations below are sometimes referred to herein as "gate electrodes", meaning electrodes that operate as gates. Gate electrodes can be produced before other layers that include channels and channel leads; such gate electrodes are often referred to as "bottom gates", and transistor structures that include them are therefore sometimes referred to herein as "bottom gate transistors".

Gate electrodes in bottom gate transistors can provide a directional orientation similar to that described above for top electrodes, but opposite in the sense that a direction away from a bottom gate toward a channel it controls is "up", "over", or "above", while a direction from a channel toward a bottom gate is "down", "under", or "below".

Figure 3:
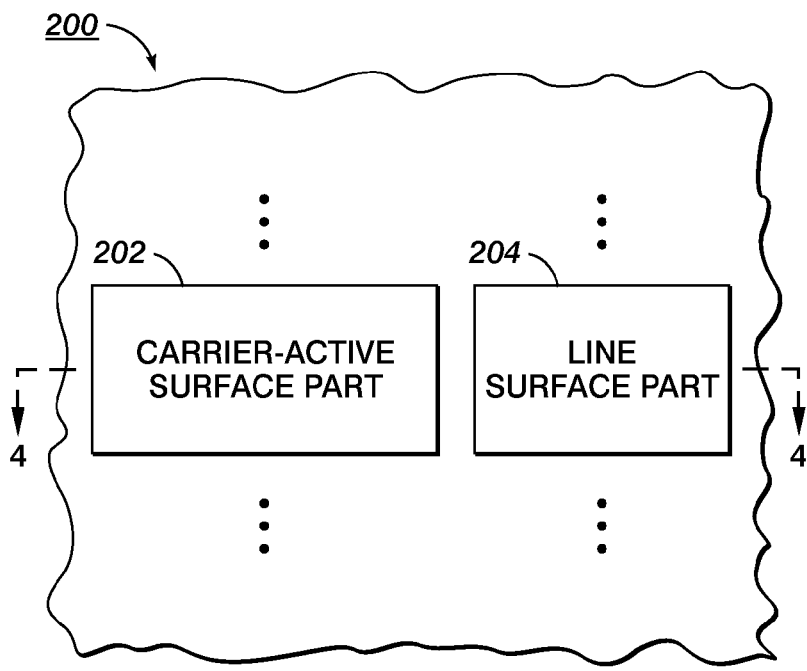
FIG. 3 is a schematic top view of a fragment of a layered structure in which a substructure has carrier-active surface parts and line surface parts.
Figure 4:
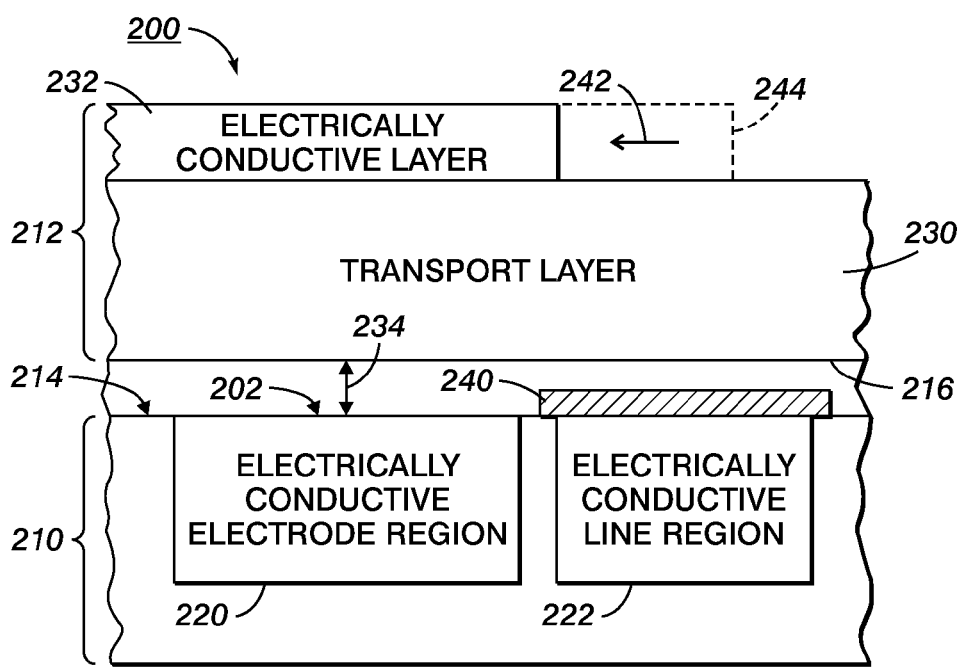
FIG. 4 is a schematic cross section of a fragment as in FIG. 3, taken along the line 4-4 in FIG. 3.

FIGS. 3 and 4 show another example of a layered structure that includes a substructure with two different types of surface parts on two different types of regions; a layered structure as in FIGS. 1 and 2 could also be an example of a layered structure as in FIGS. 3 and 4, and the techniques of FIGS. 3 and 4 can therefore be applicable in FIGS. 1 and 2. Structure fragment 200 includes one or more carrier-active surface parts, with surface part 202 being a representative example, as suggested by the ellipses above and below it. Similarly, structure fragment 200 includes one or more channel surface parts, with surface part 204 being a representative example, as suggested by the ellipses above and below it.

The cross-section of fragment 200 in FIG. 4 shows first and second substructures 210 and 212, with respective surfaces 214 and 216 disposed toward each other. As in FIG. 2, surfaces 214 and 216 are shown slightly separated for illustratively purposes, but they could meet, as in some exemplary implementations described below; also, rather than being approximately flat as shown, surfaces 214 and 216 could each depart from flatness, as in some of the exemplary implementations.

In substructure 210, surface part 202 is on electrically conductive electrode region 220, while surface part 204 is on electrically conductive line region 222. Although regions 220 and 222 could be implemented in the same electrically conductive material, as in some exemplary implementations described below, they operate differently: While line region 222 operates to transfer signals to or from other circuitry, possibly including other parts (not shown) in the same layer of material, electrode region 220 operates as part of another component, illustratively including parts of substructure 212.

Substructure 212 includes transport layer 230, an example of a "charge transport layer". The term "charge transport layer", or simply "transport layer" or "transport layer portion", used herein to refer to a layer through which charge carriers can be transported, such as in response to electric field between electrodes or other parts or components. Similarly, the term "charge generation layer" is used to refer to a layer within which free charge carriers can be generated or produced, such as in response to incident light. These terms are not, however, mutually exclusive, and charge generation and transport could occur in the same layer, such as in different regions or sublayers.

In operation of electrode region 220, charge carriers (not shown) are transported in the thickness direction of transport layer 230 in response to an electric field between electrode region 220 and electrically conductive layer 232. As suggested by bidirectional arrow 234, charge carriers could in principle be transported in either direction, but typically the predominant direction of charge carrier transport depends on the particular implementation, as illustrated by exemplary implementations described below. For example, free charge carriers produced near layer 232 in response to incident light could be transported through transport layer 230 to electrode region 220, or free charge carriers produced near region 220 in response to incident light could be transported through transport layer 230 to layer 232.

Due to signals transferred in line region 222, voltage potential difference can occur between region 222 and layer 232, in which case leakage can occur between region 222 and layer 232, interfering with signal strength or, in other words, introducing noise into signals. FIG. 4 illustrates two techniques that can be used separately or together to prevent leakage between region 222 and layer 232: In one technique, electrically insulating layer portion 240 covers line surface part 204; in another technique, layer 232 has an open region defined in it so that layer 232 does not extend substantially over line surface part 204, as suggested by arrow 242, showing how the edge of layer 232 differs from dashed outline 244 which does extend substantially over line surface part 204. Specific ways in which these techniques can be implemented are illustrated in relation to some of the exemplary implementations described below. The effectiveness of each technique may depend in part on whether transport layer 230 transports charge carriers anisotropically with transport in directions parallel to surface 216 being negligible—in this case, the open region technique may be more effective than it would be in other cases.

Figure 5:
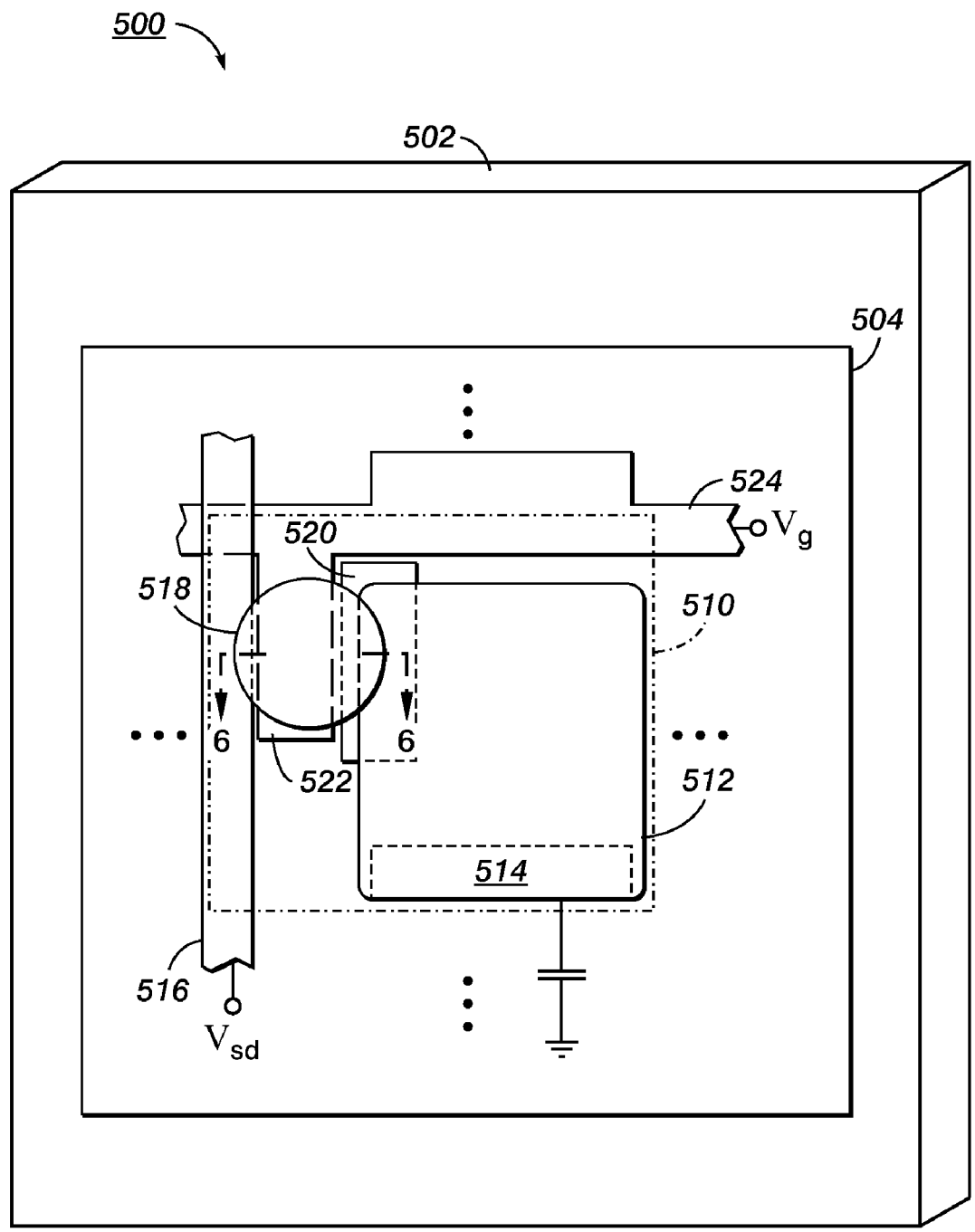
FIG. 5 is a schematic top view of an IC that includes a photosensing array.

FIG. 5 illustrates IC 500, an integrated structure that includes at least one substrate 502 and array 504, implemented with one or more of the features described above in relation to FIGS. 1-4. Array 504 includes an arrangement of cells, one or more of which could, for example, photosense light; in other implementations, a set of the cells could interact with light in other ways, such as by emitting light or by acting as a light valve. Such an IC could be implemented, for example, as a large-area visible or x-ray image sensor, and could be used in any of a wide variety of applications, such as in consumer electronics, medical imaging, inspection of structural components as in aircraft, security imaging as in airport luggage scanners, and so forth. IC 500 could be implemented, for example, with an active matrix TFT backplane and a photosensor layer. The active material in the TFTs and in the photosensor layer can include amorphous silicon (a-Si) or, as a low-cost alternative, organic polymer semiconductive material; a TFT with a channel that includes organic polymer material is sometimes referred to herein as an "organic TFT" or simply an "OTFT".

Various fabrication techniques could be used to produce IC 500. For example, with a-Si, metal layers can be deposited by sputtering, for example, and layers of dielectric and semiconductive materials can be deposited by plasma-enhanced chemical vapor deposition (PE-CVD); techniques for fabricating of structures with a-Si are described in many sources, such as in Wong, W. S., Ready, S. E., Matusiak, R., White, S. D., Lu, J. P., Ho, J. H., and Street, R. A., "Amorphous silicon thin-film transistors and arrays fabricated by jet-printing", *Applied Physics Letters*, Vol. 80, No. 4, Jan. 28, 2002, pp. 610-612. Organic polymer photosensor layers can, for example, be vapor deposited or dip-coated on a-Si backplanes, after which a top conductive layer can be deposited; alternatively, a patterned sheet with organic polymer photosensor and a top conductive layer can be laminated onto an a-Si or OTFT backplane. An OTFT backplane with organic polymer channels can be produced by vapor depositing and then patterning semiconductive organic polymer material.

Substrate 502 could, for example, be glass, plastic, or another insulating material suitable for microfabrication of electronic components on its surface. For rigidity, substrate 502 could be implemented with a rigid substrate such as glass. For flexibility, substrate 502 (and any other substrates in IC 500) could be implemented with mechanically flexible plastic material and each layered structure could be implemented with suitably thin inorganic layers to reduce mechanical stresses on the substrate(s). Further, a thin inorganic layer on the substrate could operate as a moisture barrier, protecting the substrate.

Although a-Si can be processed on a glass substrate with high temperatures, most currently available flexible substrates are susceptible to damage at high temperatures, and may require deposition processes at low temperatures, such as not exceeding approximately 200 degrees C. or another appropriate limit. More specifically, substrate 502 could be a "low-temperature substrate", meaning a substrate that is damaged if exposed to temperatures that are reached during some microfabrication processes, with the specific temperature above which damage occurs being determined by substrate material(s) and semiconductor material(s) and typically being available from a manufacturer's specifications for its materials; a low-temperature plastic substrate made of Kapton® would be typically damaged by temperatures in excess of 300 degrees C., but many plastic substrates would be damaged by temperatures in excess of lower temperatures, with some damaged by temperatures as low as 150 degrees C., and so forth.

Substrate 502 could also be a "mechanically flexible substrate", meaning a substrate that has sufficiently small thickness that it can be flexed in lateral directions, i.e. directions approximately perpendicular to its thickness direction. An example of a mechanically flexible substrate that is advantageous due to low surface roughness is polyethylene napthalate. If sufficiently flexible, for example, substrate 502 could be rolled up, such as for roll-to-roll processing or web processing, in which case substrate 502 might be a large area substrate, such as a few meters in width and many meters in length.

The above are merely illustrative examples of materials, substrates, fabrication techniques and parameters, and so forth. Various other specific examples are described below in relation to exemplary implementations, and it is foreseeable that techniques described herein could be implemented with various future-developed materials, substrates, fabrication techniques and parameters, and so forth.

Array 504 could be one of several arrays fabricated on substrate 502. Within array 504, illustrative cell 510 is shown as an area of array 504 within which a transistor structure is connected to cell electrode 512. In the illustrated example, cell electrode 512 could, for example, operate as an electrode of a capacitive component, with extension 514 of an adjacent gate line (not shown) operating as the other electrode.

Electrical connection of cell electrode 512 to conductive line 516 can be controlled by controlling conductivity of a channel in layer part 518, part of a layer of semiconductive material. Layer part 518 extends between two connecting points, at one of which it is electrically connected to electrode 512, such as through channel end electrode 520, and at the other of which it extends over and is electrically connected to a part of line 516, which operates as its other channel end electrode. Layer part 518 thus includes a channel portion whose conductivity is controlled by bottom gate electrode 522, an extension of conductive line 524 so that signals on line 524 control conductivity of the channel portion by changing voltage on electrode 522. As a result, line 516 can provide signals to and/or receive signals from cell electrode 512 when the channel portion is conductive due to signals on line 524.

Although layer part 518 illustratively includes only one FET in which conductivity of a channel portion is controlled by electrode 522, a wide variety of other transistor structures could be used in cell 510. For example, transistor structures for CMOS image sensors have been proposed with various combinations of channels, sometimes referred to as "1T" if one channel, "2T" if two, and so forth. Similarly, multiple channel transistor structures have been proposed for each cell of an active matrix array, such as for displays and other light transmissive, sensing, or emitting applications.

Figure 6:
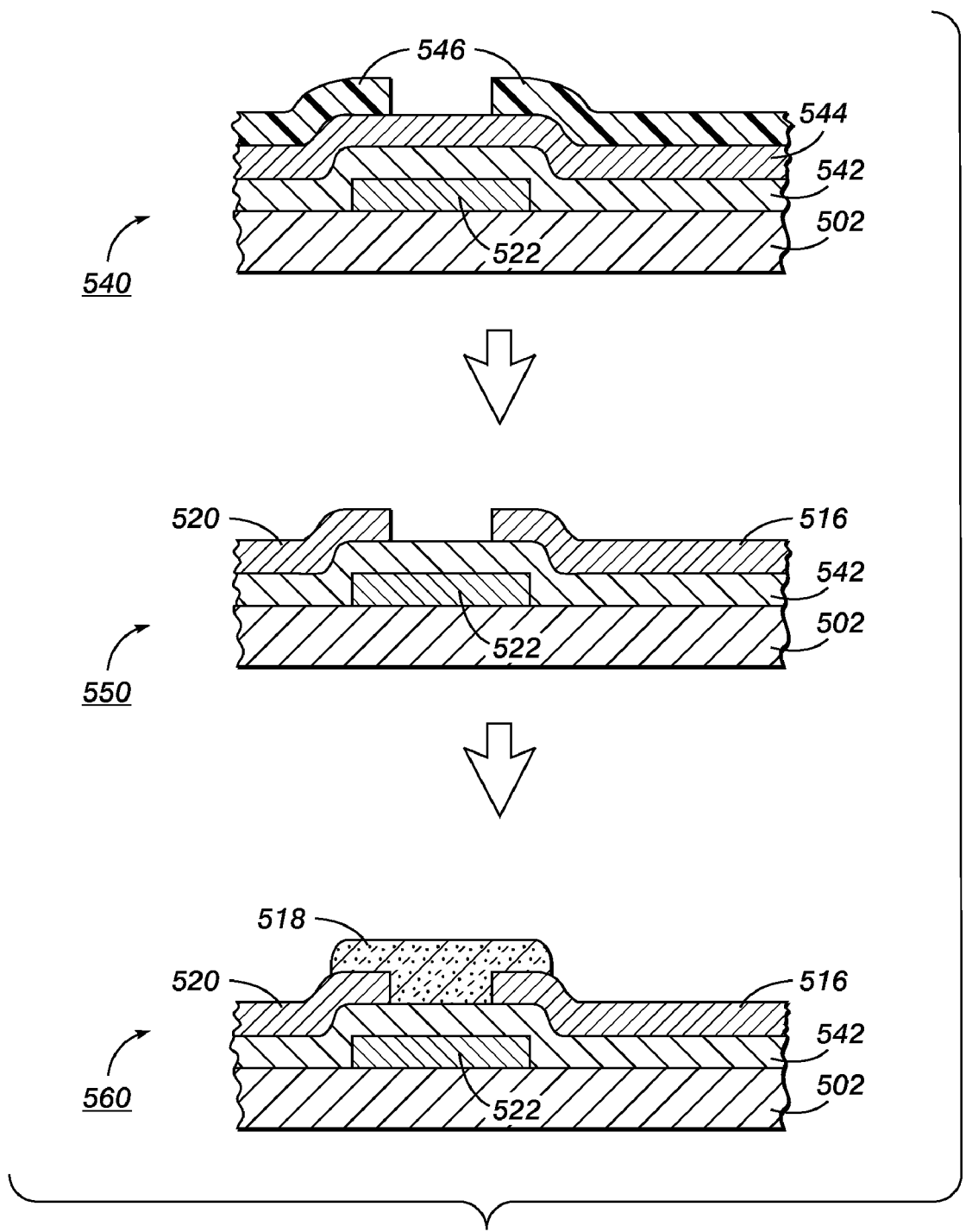
FIG. 6 shows a sequence of cross sections in producing an organic thin film transistor (OTFT) for an IC as in FIG. 5, taken along the line 6-6 in FIG. 5.

FIG. 6 shows a sequence of cross sections illustrating stages in producing active layers of IC 500, but with layer thicknesses not to scale. More particularly, the illustrated stages show production of a bottom gate transistor structure with channel end electrodes under a semiconductive layer that includes a channel portion. Additional stages before, after, and during the illustrated stages could be performed using any suitable operations, and it is foreseeable that additional and alternative operations for producing an IC with features as in FIG. 5 will be developed in the future.

Cross section 540 shows gate electrode 522 on substrate 502, with additional layers deposited over electrode 522. As noted above, substrate 502 could be any suitable insulating substrate material, such as glass, plastic, and so forth. In some implementations described herein, substrate 502 is a mechanically flexible, large area, low-temperature substrate material, such as a polymer layer or a very thin silicon nitride layer on top of a polymer layer, for example. Currently available candidate polymer materials include polyethylene napthalate, polyimide (for example Dupont Kapton® and others), polyester, and so forth, and it is foreseeable that other suitable substrate materials will be developed that could be used within the scope of the invention.

Gate electrode 522 can be printed, photolithographically patterned, or otherwise patterned directly on or over substrate 502 or another suitable support surface in one or more layers with an appropriate thickness using any suitable conductive material, such as chromium, aluminum, or other highly conductive metal or metal alloy, doped semiconductive material, a conductive combination of materials, or, if printed such as by jet printing, any suitable nanoparticle metal. It might also be possible to apply the techniques described herein to a bottom gate transistor structure with a semiconductor substrate in which the bottom gate is a heavily doped region, such as a p-type region of a silicon substrate, with a highly conductive back contact such as gold.

Gate dielectric layer 542 is illustratively on gate electrode 522, and could be implemented in any way consistent with a bottom gate transistor. For example, gate dielectric 542 can be implemented by depositing one or more layers of any suitable dielectric material or dielectric combination of materials on or over gate electrode 522 and other gate electrodes in array 504. Any of a wide variety of dielectric materials could be used, with an oxide or nitride of silicon (e.g. $SiO_2$ or $Si_3N_4$) being suitable, for example, if gate electrode 522 is chromium and with aluminum oxide ($Al_2O_3$) being suitable, for example, if gate electrode 522 is aluminum. Also, if printed such as by jet printing, gate dielectric layer 542 could include a suitable organic polymer dielectric. In general, gate dielectric layer 542 should be produced in such a way that its upper surface is suitable for subsequent production of the layered structure over it.

An active layered structure or substructure is then fabricated on gate dielectric layer 542, illustratively by depositing conductive layer 544 and then depositing and patterning a layer of resist to produce patterned layer parts 546. Conductive layer 544 can, for example, be a highly conductive material such as gold, deposited using sputtering or other suitable techniques, currently available or hereafter developed. The resist layer can similarly be any currently available or hereafter developed resist material, such as a photolithographically patterned photoresist material or a printed resist material.

Cross section 550 shows the result of then etching away exposed portions of layer 542, such as with a suitable wet etchant, and then removing layer parts 546, such as with a solvent, leaving conductive line 516 and channel end electrode 520 on gate dielectric layer 544. Alternatively, conductive line 516 and channel end electrode 520 could be produced by printing, such as by jet printing a suitable nanoparticle metal.

Cross section 560 shows the result of then producing semiconductive layer part 518 over the exposed portion of gate dielectric layer 542 between conductive line 516 and electrode 520. Layer part 518 could, for example, be a suitable organic polymer semiconductive material, printed such as by jet printing, in which case the active layers would include an OTFT. Organic polymer materials that have been successfully used in such implementations include polythiophenes, e.g. poly(3,3''' dialkylquaterthiophene) (PQT-12), and co-polymers, e.g. poly(2,5-bis(3-dodecylthiophen-2-yl) thieno[3,2-b]thiophene) (PBTTT), and it is believed that various other currently available or future-developed organic polymers could be used. Alternatively, layer part 518 could be produced by photolithographic patterning of an appropriate semiconductive material, such as a-Si, and suitable backplanes for one or more of the techniques in FIGS. 1-4 could include various other geometries; for example, each of conductive line 516 and channel end electrode 520 are illustratively under an end region of layer part 518 but could be positioned in various other ways to provide electrical connections to ends of a channel portion, such as on layer part 518 or somehow abutting it, provided fabrication constraints are not violated. Furthermore, although conductive line 516 both operates as a data line and also includes a region that operates as a channel end electrode, a layer part separate from line 516 could operate as the channel end electrode.

Techniques as in FIG. 6 have been successfully implemented to produce OTFTs and OTFT backplanes. Compatible combinations of materials mentioned above have been found. It is foreseeable, however, that various other techniques for producing OTFTs and OTFT backplanes, such as with other combinations of materials, will be developed in the future, and use of such techniques would be within the scope of the invention. Furthermore, as noted above, inorganic semiconductive materials could also be used within the scope of the invention.

Figure 7:
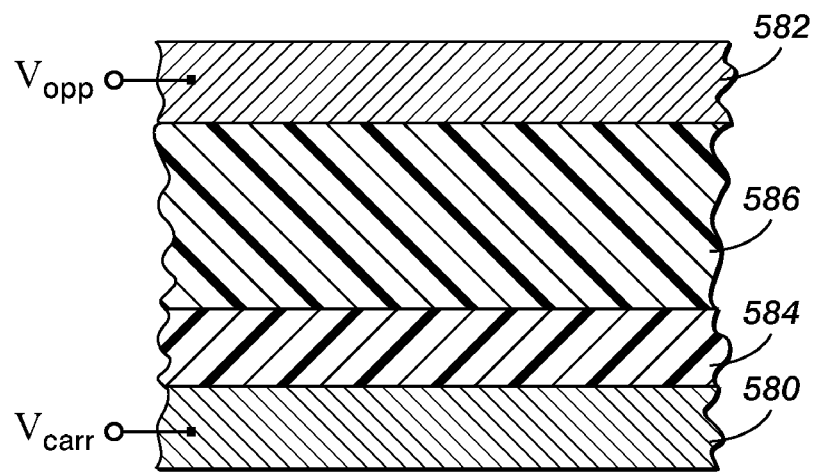
FIG. 7 is a partially schematic cross section of a general photosensor structure that can be used in an IC as in FIG. 5.

FIG. 7 illustrates in cross section general features of exemplary photosensor structures that can be used in any of a number of different ways to implement IC 500 (FIG. 5). At least one of electrode layers 580 and 582 is light transmissive, and can be a transparent conductive material such as indium-tin-oxide ITO; other examples of materials for electrode layers 580 and 582 are mentioned in relation to exemplary implementations described below. Adjacent electrode layer 580 is charge generation layer (CGL) 584, in which, in response to incident light, absorbs photons resulting in free charge carriers. Between CGL 584 and electrode layer 582 is charge transport layer (CTL) 586, which operates to split charge carrier pairs from CGL 584 and to transport charge carriers of one type from CGL 584 toward electrode 582 in response to an electric field, resulting in a photocurrent. The electric field is produced by applying a voltage across electrode layers 580 and 582 to facilitate charge separation and transport.

Various materials could be used to implemented CGL 584 and CTL 586 in photosensor structures as in FIG. 7. For an implementation in which holes from CGL 584 are split from charge carrier pairs and transported through CTL 586, for example, CGL 584 can include a dispersion of an organic polymer photoconductor in a binding matrix, e.g. a titanyl phthalocyanine in poly(vinylbutyral); a single organic photoconductor, such as poly(9,9-dioctylfluorene-alt-benzothiadiazole) (F8BT) or another polyfluorene; or another semiconductive organic polymer or blend. Also, CTL 586 can be a hole transport layer that includes a conductive polymer material, such as N,N'-diphenyl-N,N'bis(3-methylphenyl)-(1-1'-biphenyl)-4,4'-diamine (TPD), dispersed in an insulating or binding matrix such as polycarbonate, or an electron transport layer that includes a conductive organic material such as alkylated-4,-4'diphenoquinones (DPQ) dispersed in an insulating or binding matrix such as polycarbonate.

Figure 8:
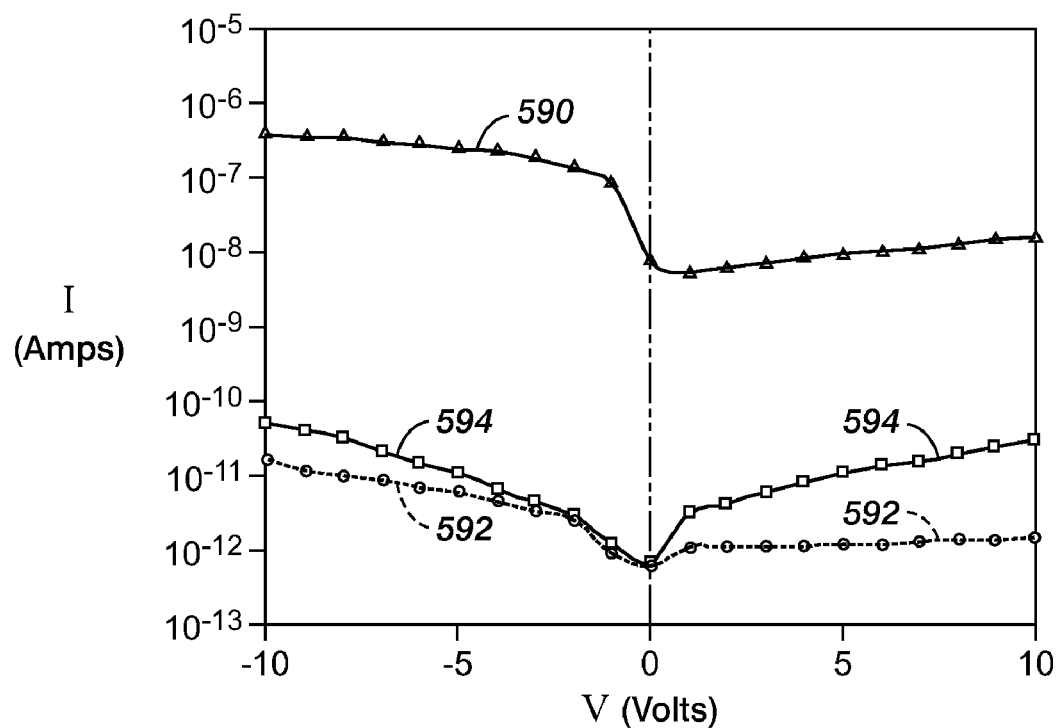
FIG. 8 is a graph showing photocurrent and dark current as a function of voltage across exemplary structures as in FIG. 7.

The graph in FIG. 8 illustrates photoresponse measured for prototype organic polymer photosensors similar to the structure in FIG. 7, but with electrode layer 580 of chromium, CGL 584 of F8BT, CTL 586 of TPD in polycarbonate, and electrode layer 582 of gold. The bandgaps of these materials allow electrons from CGL 584 to enter electrode layer 580, while holes from CGL 584 are transported through CTL 586 to electrode layer 582.

In FIG. 8, each plotted line shows current I between electrode layers 580 and 582 as a function of voltage difference V between layers 580 and 582. Plotted line 590 shows photocurrent, i.e. the current in response to light, while plotted line 592 shows current in darkness immediately after fabrication and plotted line 594 shows current in darkness six days after fabrication. As can be seen, the dark current remained sufficiently separated from the photocurrent to maintain a relatively high signal to noise ratio.

Figure 9:
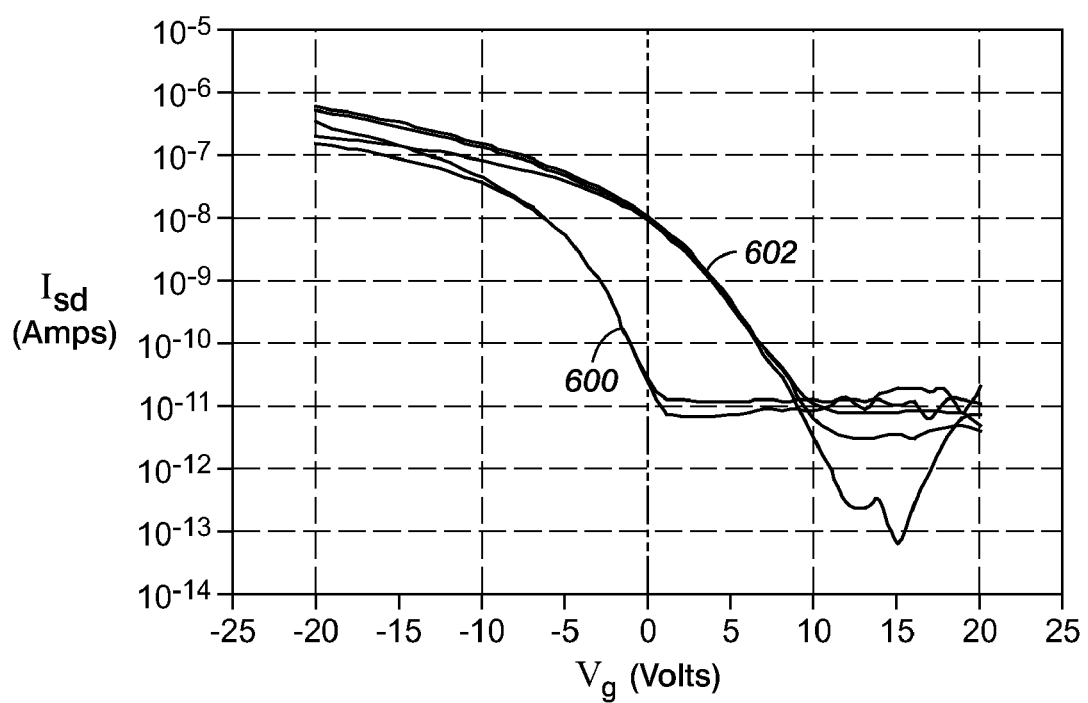
FIG. 9 is a graph showing source-drain current in OTFTs as in FIG. 6 as a function of gate voltage, before and after spin-coating with a charge transport layer as in FIG. 7.

The graph in FIG. 9 shows source-drain current as a function of $V_g$ for finished OTFTs with PQT-12 channels before and after spin-coating with a layer of TPD in polycarbonate (TPD/PC); it is expected that similar results would be obtained for channels with other polythiophenes or other semiconductive polymers with other charge transport materials directly on them, including alternatives of TPD/PC. Curves 600 show source-drain current of OTFTs before spin-coating of TPD/PC, while curves 602 show source-drain current after spin-coating. Small shifts in Von and sub-threshold slope are shown, probably due to exposure of OTFTs to ambient atmosphere during spin-coating; similar behavior has been observed for spin-coating of inert materials such as PMMA without a hole transport layer, and it is believed that spin-coating in a clean, dry atmosphere or post-annealing will mitigate this effect. More generally, the curves in FIG. 9 show that the layer of TPD in polycarbonate is acceptable because proper switching of OTFTs is observed when the layer is deposited directly on their organic polymer channels. An added advantage is that the layer of TPD in polycarbonate can act as a protecting or encapsulating layer for the OTFTs.

The result shown in FIG. 9 shows that direct contact between TFT and TPD is acceptable. Such structures are simpler than structures typically used for a-Si TFTs, which include both an encapsulation and a via layer to separate active sensor layers from the TFT backplane. The result shown in FIG. 13 might result from confinement of charge carriers at the bottom of the semiconducting polymer in the OTFT's channel and also from the energetic mismatch of the two materials—the TPD is a wider gap material than the semiconductive polymer in the channel so there is little chance for hole trapping due to the TPD. It is possible to use this result to design layered photosensor structures that implement techniques described above in relation to FIGS. 1 and 2.

FIGS. 10-15 show exemplary implementations of features described in relation to FIGS. 1-4 above in ICs as in FIGS. 5-7. Except as otherwise noted, layers and layer parts in FIGS. 10-15 are labeled with the same reference numerals as in FIGS. 5-7 and can be similarly implemented.

Figure 10:
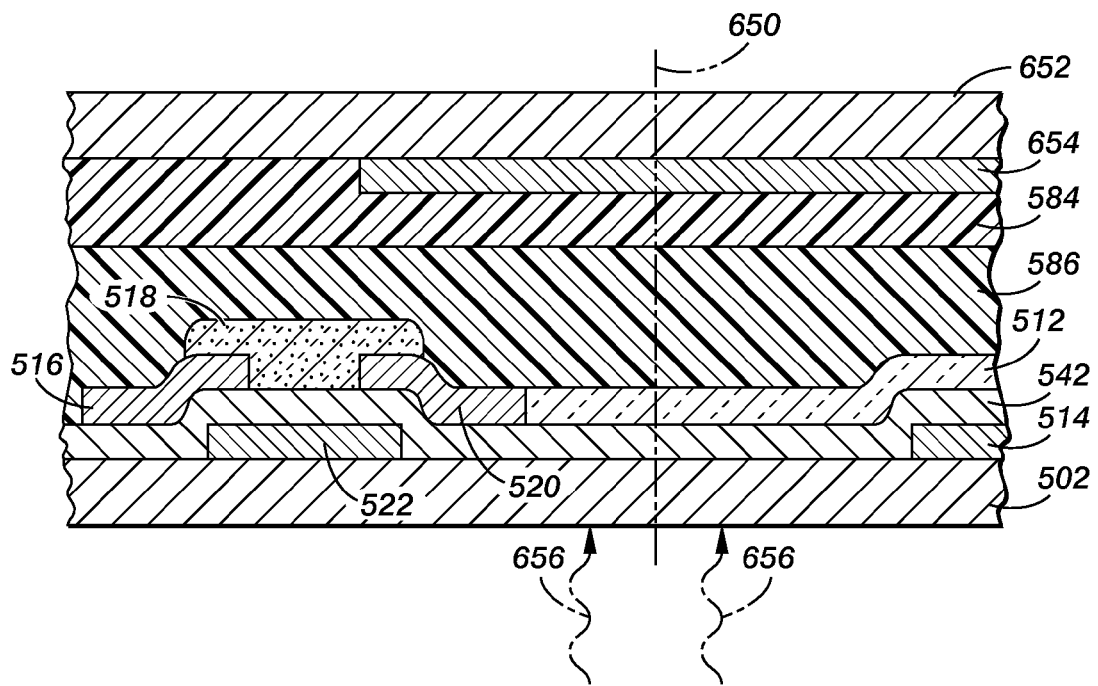
FIG. 10 is a partially schematic cross section of a cell region in one exemplary implementation of an IC as in FIG. 5.
Figure 11:
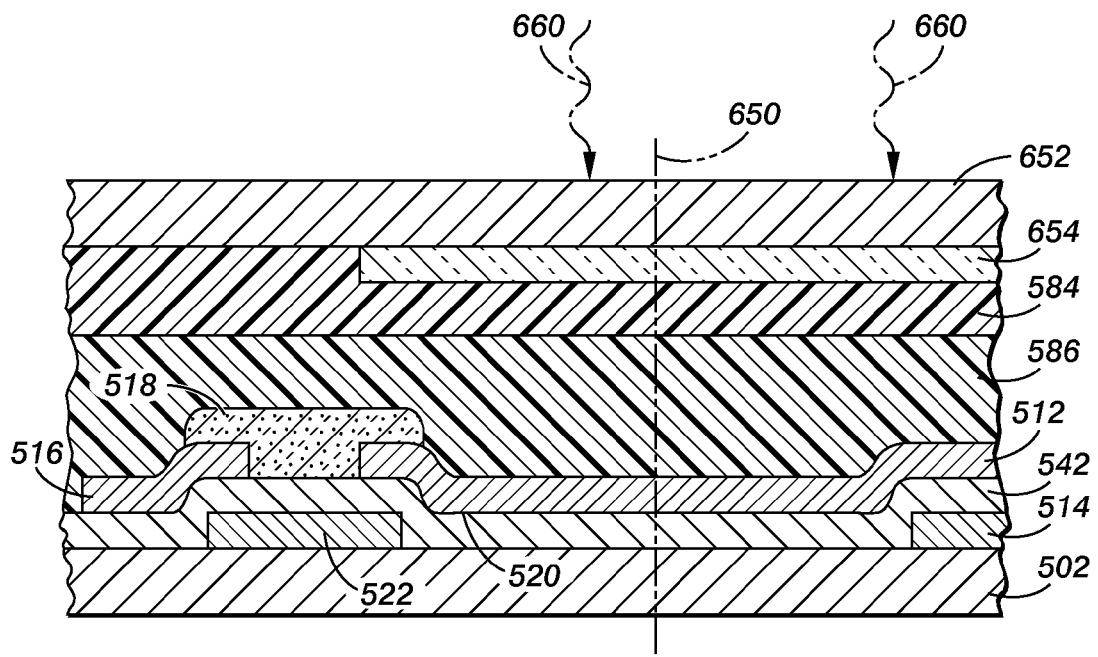
FIG. 11 is a partially schematic cross section of a cell region in another exemplary implementation of an IC as in FIG. 5.
Figure 12:
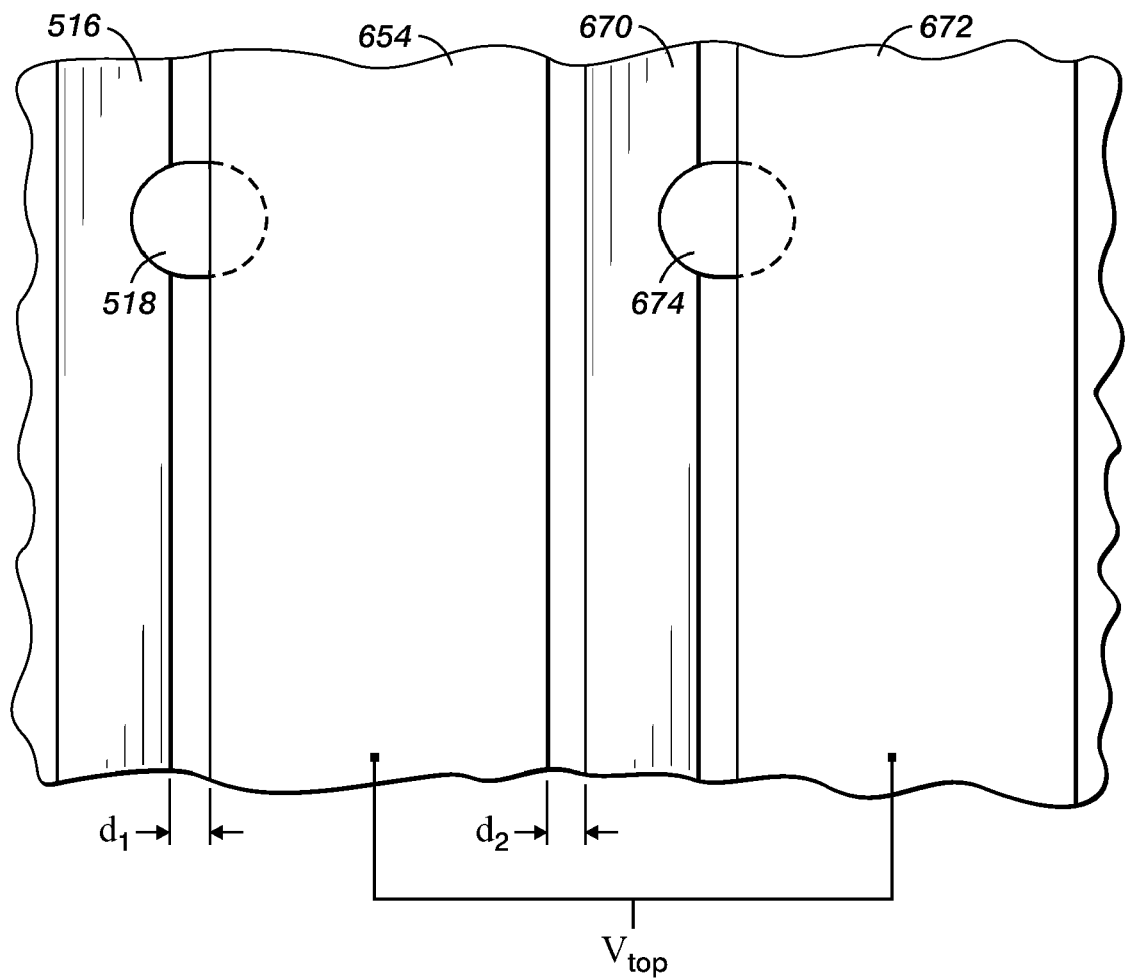
FIG. 12 is a top plan view of top electrode strips and data lines in a layout that can be used in implementations as in FIGS. 10 and 11.

The exemplary implementations in FIGS. 10-15 are related: FIG. 10 illustrates a cell region that can perform photosensing in response to illumination through the OTFT backplane substrate, also referred to as "back illumination"; a cell region as in FIG. 10 is sometimes referred to herein as an "inverted pixel". FIG. 11 illustrates a cell region that can perform photosensing in response to illumination through a top electrode, also referred to as "top illumination". FIG. 12 illustrates techniques for patterning top electrode layers in implementations as in FIGS. 10 and 11.

The cross sections in FIGS. 10 and 11 are similar to those in FIG. 6, but taken in the opposite direction or taken of cell regions that are mirror images or other variations of the cell region in FIGS. 5 and 6, with conductive line 516 at left and channel end electrode 520 at right in the OTFT. Also, the cross sections of FIGS. 10 and 11 include electrode 514 at far right, which could be seen in cross sections of the cell region of FIGS. 5 and 6 if each cross section makes a bend at intersecting line 650.

In FIG. 10, cell electrode 512 is a light-transmissive or transparent conductive material such as ITO or a conductive carbon nanotube (CNT) material. As shown, cell electrode 512 meets and is electrically connected to channel end electrode 520, and is therefore electrically connected to conductive line 516 when the channel in layer part 518 is conductive. CTL 586 is on the exposed surfaces of electrodes 512 and 520, layer part 518, and conductive line 516, while organic polymer CGL 584 is on CTL 586. In the illustrated implementation, substrate 652 at the top can be made of glass, plastic, or other suitable material, and top electrode 654 can be part of a patterned layer of conductive material on substrate 652, such as a photolithographically or digital lithographically patterned layer or a printed layer of aluminum or chromium.

In operation, incident light, illustrated by rays 656, enters through substrate 502, passes through gate dielectric layer 542 (or possibly through a patterned opening in layer 542, e.g. if it is opaque), electrode 512, and CTL 586, and is absorbed in CGL 584, producing charge carrier pairs. CTL 586 operates to separate free charge carriers and transport them from CGL 584 toward electrode 512, producing photocurrent that either increases or decreases stored charge in a capacitive component that includes parts of electrodes 512 and 514. In general, the magnitude of stored charge therefore indicates intensity of illumination at the location of the illustrated cell region, and can therefore be read out through conductive line 516 by turning on the OTFT in accordance with suitable array readout techniques, including CMOS readout techniques and other currently available techniques and also foreseeably including future developed readout techniques.

In FIG. 10, layer part 518, which includes the OTFT's channel, is protected from illumination by opaque gate electrode 522, which therefore acts as a light shield. This shielding effect is beneficial for OTFTs implemented with semiconductor material that has a large photoresponse. Also, CTL 586 can be implemented with a small-molecule polymer dispersed in an insulating matrix and deposited over layer part 518 during fabrication, and can therefore provide environmental encapsulation for organic polymer semiconductor in layer part 518 during subsequent processes.

In FIG. 11, cell electrode 512 is integrally formed with electrode 520 in the same layer of conductive material, and is therefore similarly electrically connected to conductive line 516 when the channel in layer part 518 is conductive. Other layers are as in FIG. 10, except that top electrode 654 is a light-transmissive or transparent conductive material such as ITO or conductive CNT material, again part of a patterned layer on substrate 652, with direct jet-printing being appropriate if transparent conductors such as CNT dispersions are available.

In operation of the cell region in FIG. 11, however, incident light, illustrated by rays 660, enters through substrate 652, passes through top electrode 654, and is absorbed in CGL 584, producing charge carrier pairs. As in FIG. 10, CTL 586 operates to separate free charge carriers and transport them from CGL 584 toward electrode 512, producing photocurrent that either increases or decreases stored charge that can be read out as described above.

In FIG. 11, layer part 518, which includes the OTFT's channel, is less protected from illumination than in FIG. 10, except to the extent CGL 584 absorbs incident light. As in FIG. 10, CTL 586 can provide environmental encapsulation for organic polymer semiconductor in layer part 518.

FIG. 12 shows a top electrode pattern that can be used to implement ICs with cell regions as in FIGS. 10 and 11, also implementing some features described above in relation to FIGS. 3 and 4. CGL 584 and CTL 586 are not shown in FIG. 12 because they are not patterned and are therefore present throughout the illustrated area; certain other layers and layer parts are also omitted because not relevant to the illustrated features.

As in FIGS. 10-11, layer part 518 extends over and is electrically connected to conductive line 516 and top electrode 654, which is part of a top electrode strip extending in a lateral direction across a line of cell regions along and parallel to conductive line 516; as suggested by FIG. 12, the implementation includes a series of similarly shaped top electrode strips. Conductive line 670 is on the opposite side of electrode 654 from conductive line 516, on the other side of the same line of cell regions and between electrode 654 and adjacent top electrode strip 672. Similarly to layer part 518, semiconductive layer part 674 in an adjacent cell region extends over and is electrically connected to conductive line 670, but can also extend under top electrode strip 672. Like the strip that includes top electrode 654, top electrode strip 672 extends in a lateral direction over a line of cell regions along and parallel to conductive line 670.

In a photosensing array with layers like CGL 584 and CTL 586, a conductive path between a top electrode and a data line through CGL 584 and CTL 586, such as for photocurrent, degrades performance. In effect, noise on the data line increases, and the signal-to-noise ratio accordingly decreases. Gaps d1 and d2 in FIG. 12 illustrate one way to reduce this problem. If CGL 584 and CTL 586 are structured so that charge carriers are transported anisotropically as described above in relation to FIG. 2, and if neither adjacent top electrode extends over a data line, then the data line's signal-to-noise performance should not be reduced due to parasitic leakage of this kind. In some cases, anisotropy of carrier transport in CTLs can be controlled by modification of the composition of dispersed charge carrier in an insulating matrix.

In the technique of FIG. 12, adjacent top electrode strips in the series are separated by sufficient gaps that the gap between them equals at least the sum of (d1+d2) plus the maximum width of conductive lines 516, 670, and so forth. As a result of this relatively coarse patterning, alignment of top electrode strips with data lines is much simpler than if each cell region had a respective top electrode that was more precisely patterned to fit the cell region's area: The top electrode strips must be sufficiently close to parallel with the data lines that they do not extend over them and must also be registered in a direction perpendicular to the data lines so that each data line fits within the gap between adjacent top electrode strips while not being covered by either top electrode strip; both of these alignment issues can be made easier by increasing (d1+d2), i.e. by increasing the gap between adjacent top electrode strips so that its difference from the data line width is greater. Also, as suggested by the connections to $V_{top}$ in FIG. 12, the circuitry necessary to connect all top electrodes to the top electrode voltage, $V_{top}$, is simpler than if it were necessary to separately connect each cell region's top electrode to $V_{top}$.

Figure 13:
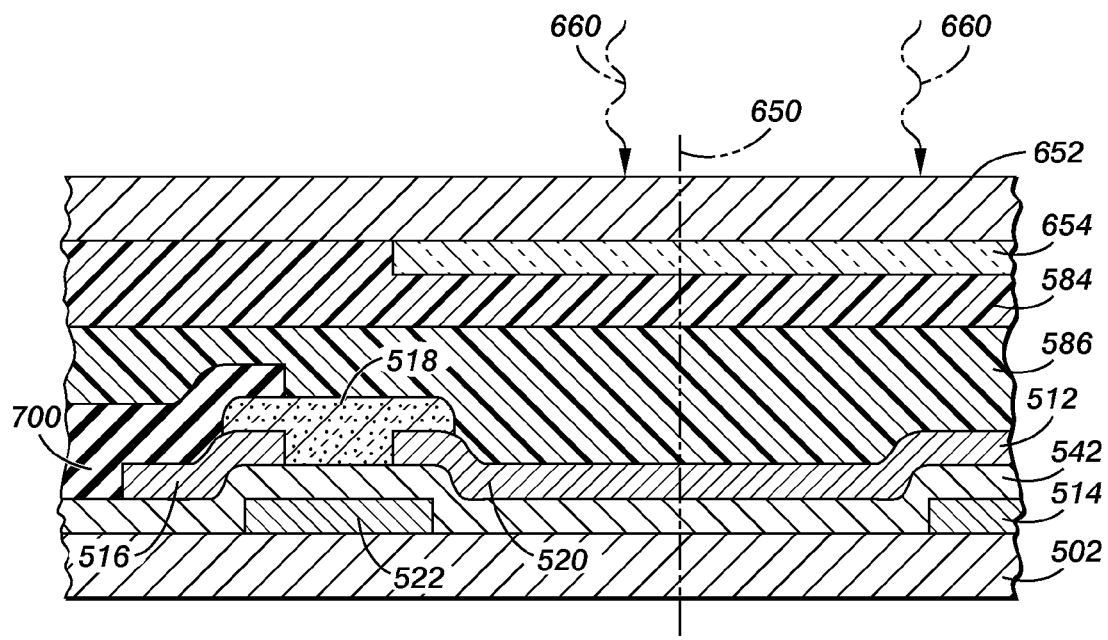
FIG. 13 is a partially schematic cross section of a cell region in another exemplary implementation of an IC as in FIG. 5.
Figure 14:
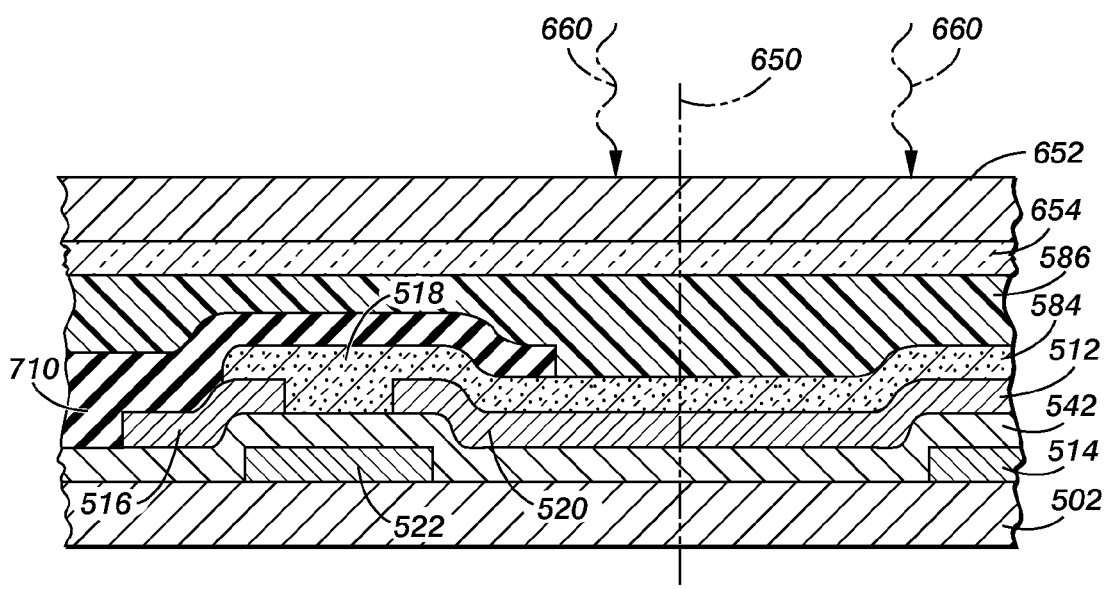
FIG. 14 is a partially schematic cross section of a cell region in another exemplary implementation of an IC as in FIG. 5.
Figure 15:
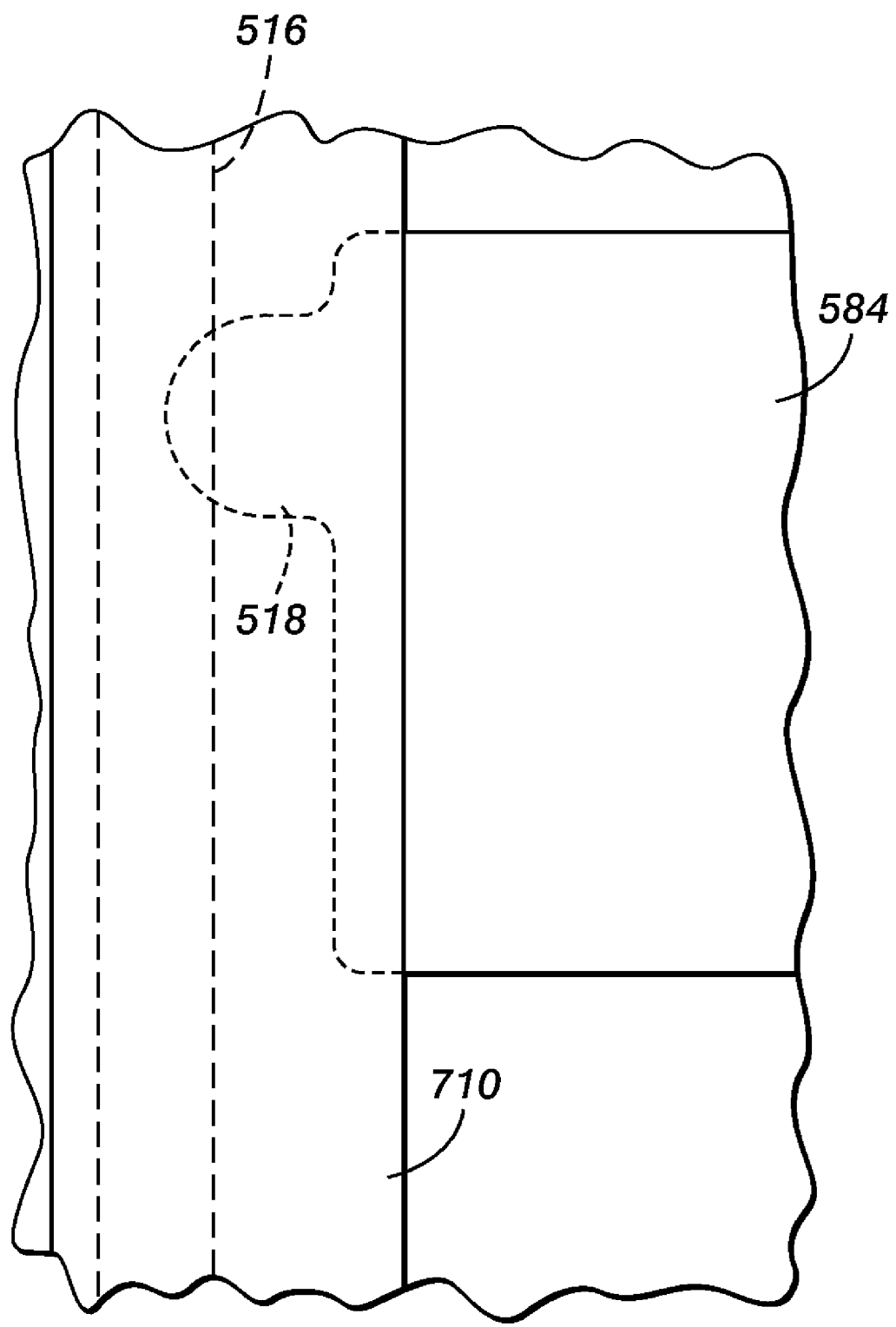
FIG. 15 is a top plan view of encapsulation over a data line and an OTFT channel in a layout that can be used in implementations as in FIG. 14.

The exemplary implementations in FIGS. 13-15 are also related: The cross sections in FIGS. 13 and 14 are taken along a line like that of FIG. 11, with FIG. 13 illustrating a cell region with encapsulation of conductive line 516 and FIG. 14 illustrating layer part 518 and cell electrode 522 implemented with the same semiconductive polymer material; in FIG. 14, encapsulation is extended to cover layer part 518. FIG. 15 illustrates techniques for patterning encapsulant in implementations as in FIG. 14.

In FIG. 13, which illustrates an example of features shown in FIGS. 1-4, encapsulant 700 extends over data line 516, preventing parasitic leakage current between top electrode 654 and data line 516. As shown, encapsulant 700 can be used together with the technique described above in relation to FIG. 11, or encapsulant 700 could be used with an unpatterned top electrode layer that extends over data line 516 if encapsulant 700 is sufficient by itself to prevent leakage current. Encapsulant 700 could be implemented as a patterned layer of dielectric material, photolithographically patterned or printed, such as a printable wax material of the type used for digital lithography or other printable dielectric polymer material.

In FIG. 14, which illustrates an example of features shown in FIGS. 3-4, layer part 518 and CGL 584 both include the same semiconductive polymer material, and therefore can, if appropriate, be formed in parallel such as by photolithography or in sequence during a single operation such as by printing. The semiconductive polymer material could, for example, be any of various semiconductive organic polymers that are available for TFT channels and that can operate as a CGL with an appropriate CTL. Layer part 518 could, for example, be a suitable organic polymer semiconductive material, printed such as by jet printing, in which case the active layers would include an OTFT. Organic polymer materials that are expected to be successful in such implementations include photoconductive polythiophenes, e.g. poly(3,3‴-dialkylquaterthiophene) (PQT-12), and photoconductive copolymers, e.g. poly(2,5-bis(3-dodecylthiophen-2-yl)thieno [3,2-b]thiophene) (PBTTT), and it is believed that various other currently available or future-developed photoconductive organic polymers could be used. More generally, it may be possible to implement another light-interactive component rather than CGL 584 with the same semiconductive polymer material as layer part 518, or to implement two other types of subregions with the same semiconductive polymer material, with one subregion including a channel and the other being light-interactive.

In FIG. 14, opaque, electrically insulating encapsulant 710 can be implemented similarly to encapsulant 700 in FIG. 13, with a light absorbent dielectric material, patterned so that it extends not only over conductive line 516 but also over layer part 518, which includes the OTFT's channel, but not entirely over CGL 584. In this implementation, encapsulant 710 not only prevents leakage current between top electrode 654 and conductive line 516 but also acts as a light shield that protects the channel in layer part 518 from contact with CTL 586 and from incident light. Protection from incident light is necessary in such an implementation because using the same materials for TFT and CGL requires that the TFT be insensitive to light in order to be an acceptable switch for typical applications.

In operation of the cell region in FIG. 14, incident light, illustrated by rays 660, enters through substrate 652, passes through top electrode 654 and CTL 586, and is absorbed in CGL 584, producing charge carrier pairs. Similarly to FIG. 10, CTL 586 operates to separate free charge carriers and transport them from CGL 584 toward top electrode 654, producing photocurrent that either increases or decreases stored charge that can be read out as described above.

FIG. 15 shows an encapsulant pattern that can be used to implement ICs with encapsulant 710 as in FIG. 14. Top electrode 564 and CTL 586 are not shown in FIG. 15 because they are not patterned and are therefore present throughout the illustrated area; certain other layers and layer parts are also omitted because not relevant to the illustrated features.

Similarly to FIG. 12, layer part 518 extends over and is electrically connected to conductive line 516, but both are shown in dashed line in FIG. 15 because both are under encapsulant 710. The patterned layer of semiconductive polymer material that includes layer part 518 also includes, however, CGL 584, which illustratively connects to layer part 518 and extends from there out from under encapsulant 710, so that it can receive incident light from top illumination even though the channel in layer part 518 is protected from incident light. Encapsulant 710 extends in a lateral direction over conductive line 516, covering the channels of OTFTs in a line of cell regions along conductive line 516. This geometry avoids the need to pattern encapsulant 710 separately for each cell region.

Figure 16:
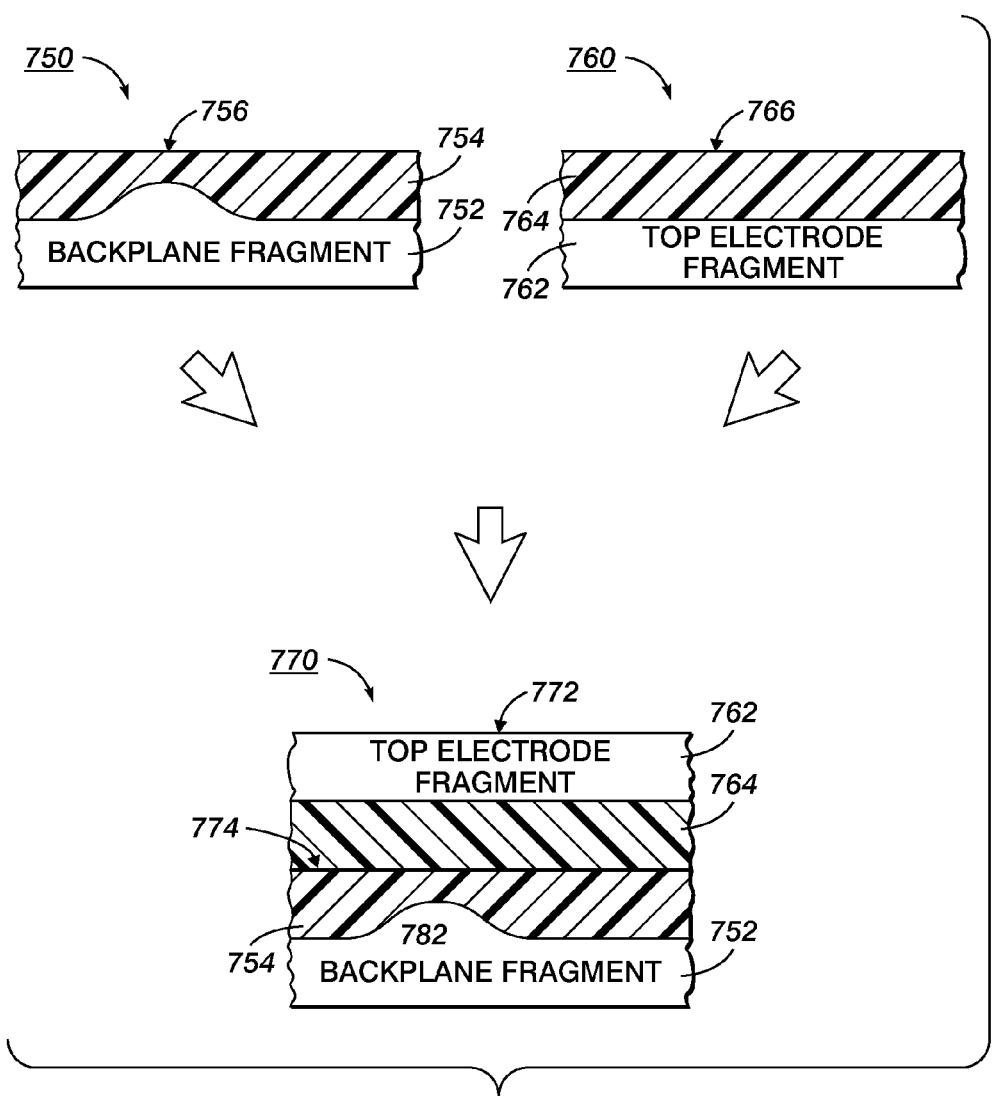
FIG. 16 shows cross sections in a lamination technique that can be used to produce an IC as in FIG. 5.
Figure 17:
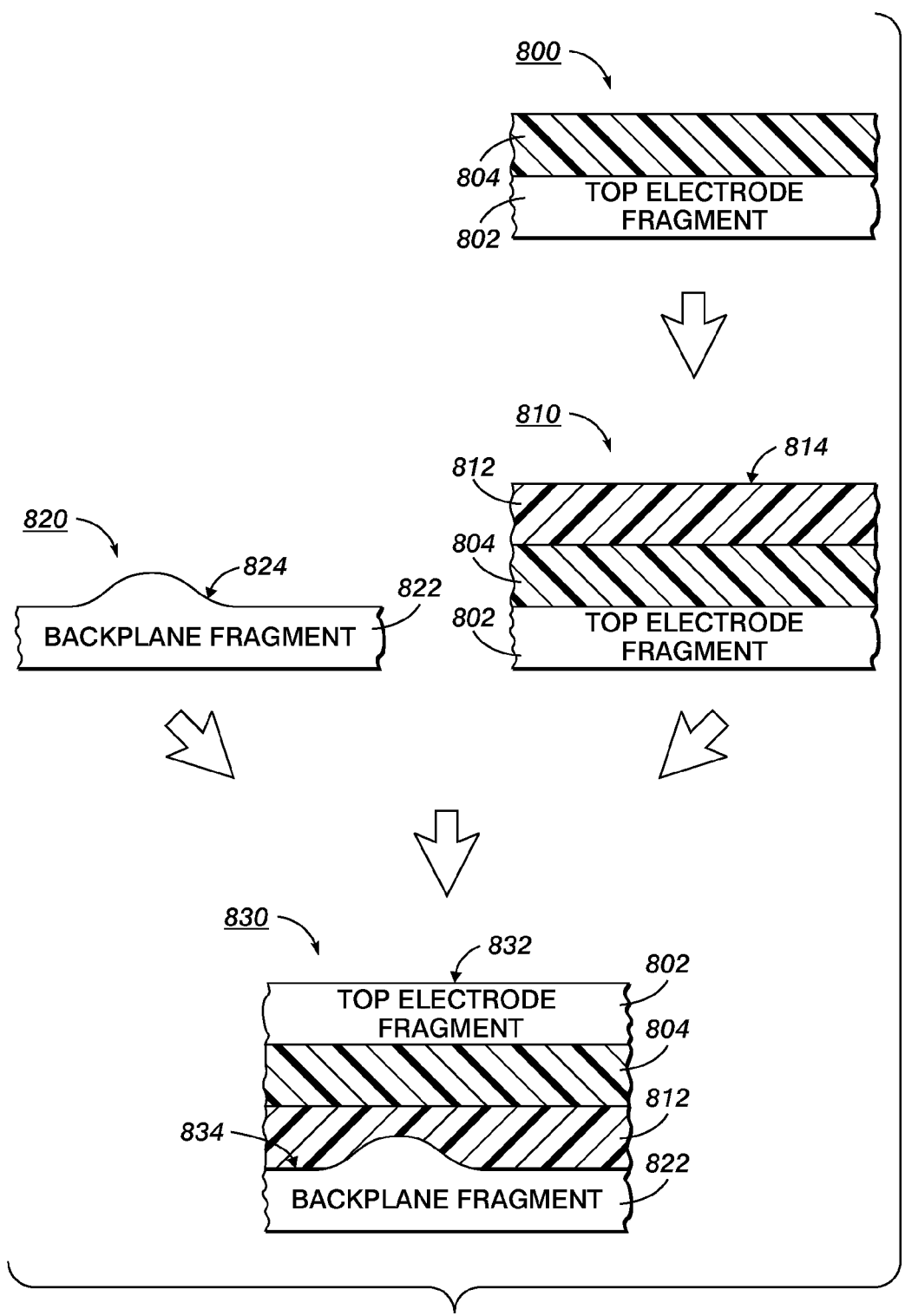
FIG. 17 shows cross sections in another lamination technique that can be used to produce an IC as in FIG. 5.
Figure 18:
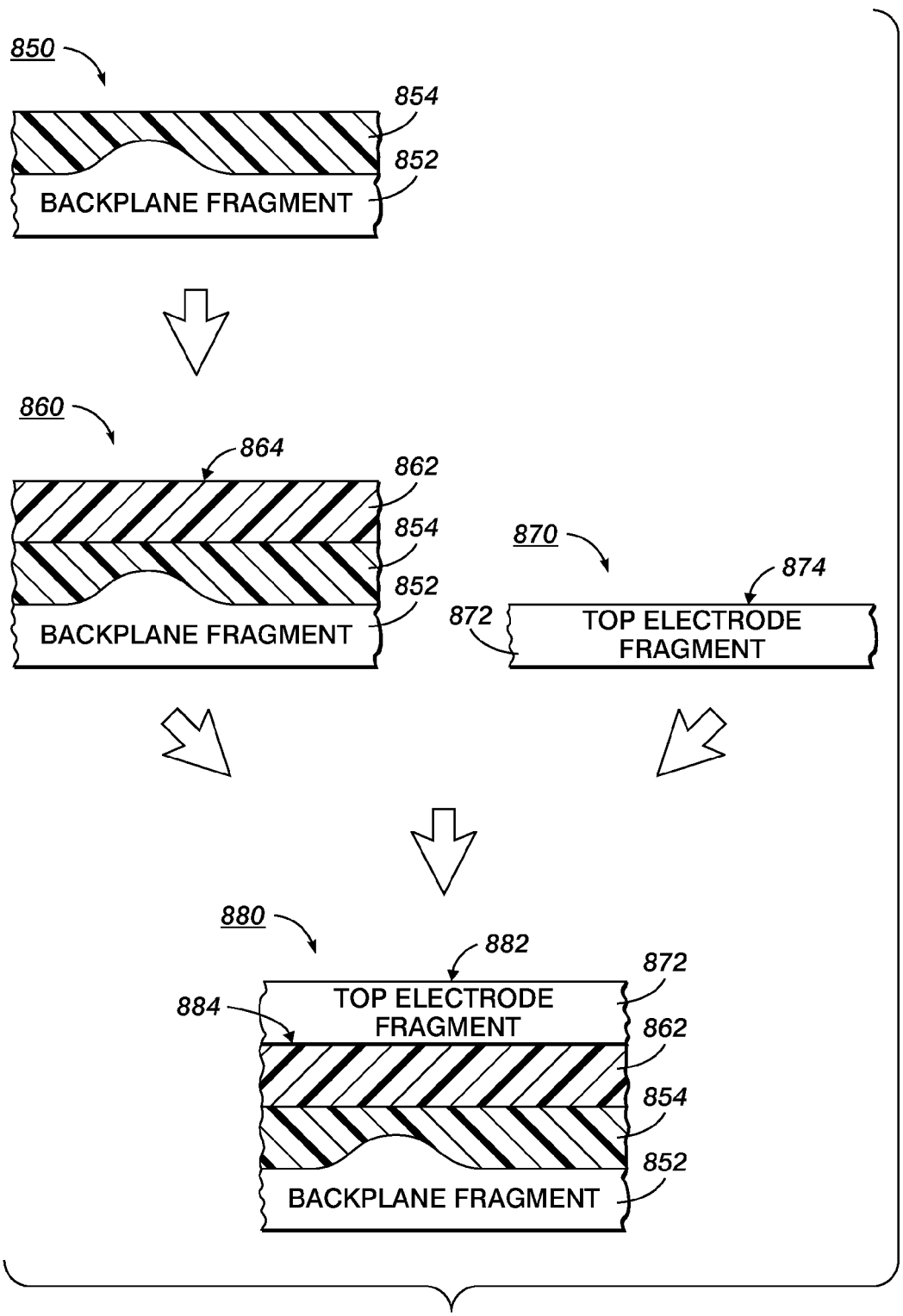
FIG. 18 shows cross sections in another lamination technique that can be used to produce an IC as in FIG. 5.

FIGS. 16-18 illustrate lamination techniques that can, with suitable modifications, be used to produce ICs as described above in relation to FIGS. 5-15.

In the lamination technique of FIG. 16, surfaces of two polymer-containing layers meet at an interface surface. The two polymer-containing layers are produced separately before lamination, such as by solution processing, and, in addition to solution processing artifacts, lamination artifacts of various kinds could occur on either of the polymer-containing layers, such as at the interface surface, or in either of the polymer-containing layers. Further details about lamination and lamination artifacts are described in co-pending U.S. patent application Ser. No. 11/959,187, entitled "Producing Layered Structures with Lamination", incorporated herein by reference in its entirety.

As shown in cross section 750, backplane fragment 752, shown in outline for generality, is from an IC with an array in which cell regions include OTFTs. Such an IC could be implemented in any of the ways described above or in other suitable ways. Polymer-containing layer 754 has been produced over backplane fragment 752, such as by spin-coating or dip-coating a CTL, a CGL, or part of a CTL or by another suitable solution processing technique. Alternatively, a xerographic CTL or CGL in sheet form could be laminated onto backplane fragment 752 to produce layer 754. In any case, layer 754 has surface 756 suitable for lamination.

As similarly shown in cross section 760, top electrode fragment 762, also shown in outline for generality, could be implemented in any of the ways described above or in other suitable ways. Polymer-containing layer 764 has been produced over top electrode fragment 762, such as by a suitable solution processing techniques such as spin-coating or dip-coating a CGL, a CTL, or another part of a CTL where part of the CTL has already been spin-coated on backplane fragment 652. Alternatively, a xerographic CGL or CTL in sheet form could be laminated onto top electrode fragment 762. Like layer 754, layer 764 has surface 766 suitable for lamination.

Cross section 770 shows the result of lamination, in which IC fragment 772 includes backplane fragment 752, top electrode fragment 762, and both of polymer-containing layers 754 and 764. In this implementation, interface surface 774 occurs where surfaces 756 and 766 meet, between layers 754 and 764.

In the lamination technique of FIG. 17, a surface of a polymer-containing layer meets a surface of a backplane at an interface surface. Polymer-containing layers are produced on top electrode layers before lamination, such as by solution processing, and, in addition to solution processing artifacts, lamination artifacts of various kinds could occur at the interface surface or in the polymer-containing layer whose surface meets the backplane surface.

As shown in cross section 800, top electrode fragment 802 has polymer-containing layer 804. Layer 804 could be produced on top electrode fragment 802, such as by a solution processing technique such as spin-coating or dip-coating, or by laminating a CGL or a CTL. As shown in cross section 810, polymer-containing layer 812 has been produced on layer 804, again such as by a solution processing technique such as spin-coating or dip-coating, or by laminating a CTL or a CGL. As an alternative, layers 804 and 812 could be concurrently laminated to fragment 802 in sheet form. In any case, layer 812 has surface 814 suitable for lamination.

As shown in cross section 820, backplane fragment 822 does not have a polymer-containing layer over its surface 824 prior to lamination. But surface 824 must be suitable for lamination with surface 814.

Cross section 830 shows the result of lamination, in which IC fragment 832 includes backplane fragment 822, top electrode fragment 802, and both of polymer-containing layers 804 and 812. In this implementation, interface surface 834 occurs where surfaces 814 and 824 meet, between layer 812 and the backplane.

In the lamination technique of FIG. 18, a surface of a polymer-containing layer meets a surface of a top electrode at an interface surface. Polymer-containing layers are produced on a backplane before lamination, such as by solution processing, and, in addition to solution processing artifacts, lamination artifacts of various kinds could occur at the interface surface or in the polymer-containing layer whose surface meets the top electrode surface.

As shown in cross section 850, backplane fragment 852 has polymer-containing layer 854. Layer 854 could be produced on backplane fragment 852, such as by a solution processing technique such as spin-coating or dip-coating, or by laminating a CTL or a CGL. As shown in cross section 860, polymer-containing layer 862 has been produced on layer 854, again such as by a solution processing technique such as spin-coating or dip-coating, or by laminating a CGL or a CTL. As an alternative, layers 854 and 862 could be concurrently laminated to fragment 852 in sheet form. In any case, layer 862 has surface 864 suitable for lamination.

As shown in cross section 870, top electrode fragment 872 does not have a polymer-containing layer over its surface 874 prior to lamination. But surface 874 must be suitable for lamination with surface 864.

Cross section 880 shows the result of lamination, in which IC fragment 882 includes backplane fragment 852, top electrode fragment 872, and both of polymer-containing layers 854 and 862. In this implementation, interface surface 884 occurs where surfaces 864 and 874 meet, between layer 862 and the top electrode.

As indicated by the results shown in FIGS. 8 and 9, transport layer and leakage prevention techniques similar to those described herein have been successfully tested, and the result included satisfactory photoresponse and source-drain current for organic TFTs with spin-coated transport layers. Specifically, in test implementations with a transport layer directly on an organic TFT channel, OFF current increased less than an order of magnitude from implementations with an insulator between transport layer and organic TFT channel. The techniques described above are therefore expected to provide a robust way to make devices, arrays, and other products, including various additional products besides the specific types mentioned herein.

Some of the implementations described above in relation to FIGS. 1-18 are examples of a layered structure that includes a carrier-transporting substructure and a circuitry substructure. The carrier-transporting substructure includes solution processing artifacts and, in operation in an application, transports charge carriers in a thickness direction anisotropically, with negligible transport in directions perpendicular to the thickness direction; the substructure has a facing surface approximately perpendicular to the thickness direction. The circuitry substructure has surface parts disposed toward the facing surface of the carrier-transporting substructure, the surface parts including charge-flow surface parts and channel surface parts. Charge carriers flow to or from the carrier-transporting substructure's facing surface through the charge-flow surface parts during operation, with each charge-flow surface part being on an electrically conductive region. Each channel surface part is on a semiconductive channel region, and each of a set of the channel regions operates as an acceptable switch in the application.

In specific implementations, the surface parts can include two or more charge-flow surface parts. A channel surface part can meet the facing surface of the carrier-transporting substructure. The circuitry substructure can include an array with cell regions, each of a set of which include at least one charge-flow surface part and its electrically conductive region and at least one channel surface part and its semiconductive channel region.

In specific implementations, the surface parts can include two or more charge-flow surface parts. A channel surface part can meet the facing surface of the carrier-transporting substructure. The circuitry substructure can include an array with cell regions, each of a set of which include at least one charge-flow surface part and its electrically conductive region and at least one channel surface part and its semiconductive channel region.

In further specific implementations, the carrier-transporting substructure can include polymer material, blends of polymers, and/or polymerized organic compounds, including specific examples listed above. The carrier-transporting substructure can include a first layer in which free charge carriers are generated in response to light and a second light in which charge carriers are transported in the thickness direction in response to electric field; the first layer can include a dispersion of organic photoconductor material in a binding matrix and/or an organic polymer or blend, while the second layer can include a dispersion of conductive organic polymer material in a binding matrix.

In further specific implementations, the solution processing artifacts can include a coffee drop pattern and/or streaking due to spin casting. The application can be photosensing, and the charge carriers can be generated in response to incident light. Each channel region that operates as an acceptable switch can meet a criterion that includes minimum ON conductivity, maximum OFF current, and/or maximum switching time.

Some of the examples described above in relation to FIGS. 1-18 are examples of a method that produces a layered structure that includes a carrier-transporting substructure and a circuitry substructure as described above. In producing the layered structure, the method performs solution processing to produce at least one layer of the carrier-transporting substructure. The method also attaches the carrier-transporting substructure and the circuitry substructure with the facing surface of the carrier-transporting substructure disposed toward the surface parts, and so that each of a set of channel regions operates as an acceptable switch in the application.

In specific implementations, solution processing can include depositing polymer material or one or more blends of polymers. For example, polymerized organic compounds can be deposited. At least one layer of the carrier-transporting substructure can be deposited directly on the circuitry substructure, or a first layered structure that includes the carrier-transporting substructure can be laminated with a second layered structure that includes the circuitry substructure.

Some of the implementations described above in relation to FIGS. 1-18 are examples of a photosensing device that includes a layered carrier-transporting substructure and a layered array substructure. The carrier-transporting substructure is as described above, with one or more solution processing artifacts. The array substructure includes two or more cell regions each having surface parts that meet the facing surface of the carrier-transporting substructure. Each cell region's surface parts include charge-flow surface parts and channel surface parts. Charge carriers flow to or from the carrier-transporting substructure's facing surface through the charge-flow surface parts during operation in the application, and each charge-flow surface part is on an electrically conductive portion of the cell region. Each channel surface part is on a semiconductive channel portion of the cell region and a set of the channel portions operate as acceptable switches in the application.

In specific implementations, the carrier-transporting substructure can include a first layer in which free charge carriers are generated in response to incident light and a second layer in which charge carriers are transported in the thickness direction in response to electric field. The facing surface can be on the second layer; during operation, charge carriers can be transported through the second layer to the facing surface and flow through the facing surface to a charge-flow surface part's electrically conductive portion.

In further specific implementations, the carrier-transporting substructure can include a transport layer and an electrically conductive layer over the transport layer, which is between the electrically conductive layer and the circuitry substructure. The circuitry substructure can also include line surface parts, each on an electrically conductive line region. The device can include, over each of a set of line surface parts, one of the following: an open region defined in the electrically conductive layer so that it does not extend substantially over the line surface part; and an electrically insulating layer portion covering the line surface part.

Some of the implementations described above in relation to FIGS. 1-18 are examples of a layered structure that includes a first substructure with a patterned surface and a second substructure over the patterned surface. The patterned surface includes carrier-active surface parts, each on an electrically conductive electrode region, and line surface parts, each on an electrically conductive line region that carriers electrical signals in operation. The second substructure includes a transport layer on a set of the carrier-active surface parts and an electrically conductive layer over the transport layer. In operation, the transport layer transports charge carriers in a thickness direction toward or away from the carrier-active surface parts in the set. The layered structure also includes, over a set of the line surface parts, one of the following: an open region defined in the electrically conductive layer so that it does not extend substantially over the line surface part; and an electrically insulating layer portion covering the line surface part.

In specific implementations, each carrier-active surface part can be a charge-flow surface part and the transport layer can transport charge carriers to or from it. The first substructure can also include a semiconductor channel region that, when conductive, provides an electrical connection between one of the electrically conductive electrode regions and one of the electrically conductive line regions. The first substructure can also include an array with cell regions, each of a set of which includes portions of the first substructure including at least one carrier-active surface part and its electrically conductive electrode. The transport layer can transport charge carriers in the thickness direction anisotropically, with negligible transport in directions perpendicular to thickness direction.

In further specific implementations, the transport layer can include polymer material, blends of polymers, and/or polymerized organic compounds, including examples listed above. The transport layer can include a dispersion of conductive organic polymer material in an insulating or binding matrix. The second substructure can also include a generation layer in which free charge carriers are generated in response to light, between the transport layer and the electrically conductive layer over the transport layer.

Some of the implementations described above in relation to FIGS. 1-18 are examples of a photosensing device that includes a layered array structure with an array of cell regions.

The layered array structure can include first and second substructures, with each of a set of the cell regions including portions of the first and second substructures. Each cell region's first substructure portion has a respective patterned surface, and each cell region's second substructure portion is over the cell region's patterned surface. The patterned surface includes carrier-active surface parts and line surface parts as described above. The electrode region of each carrier-active surface part does not extend outside the cell region. The electrically conductive line portion of each line surface part is electrically connected to carry electric signals between the cell region and circuitry outside the array. Each cell region's second substructure portion includes a transport layer portion and an electrically conductive layer portion over the transport layer portion. The transport layer portion is on at least a set of carrier-active surface parts and, in operation, transports charge carriers in the thickness direction toward or away from the carrier-active surface parts in the set. The electrically conductive layer portion is over the transport portion. The layered array structure also includes at least one of the following: an open region defined in the electrically conductive layer portion so that it does not extend substantially over the line surface part; and an electrically insulating layer portion covering the line surface part.

In specific implementations, each cell region's electrically conductive line portions can include a data line portion, and the first substructure includes data lines that connect to circuitry outside the array; each data line can include the data line portions of a subset of the cell regions. Each cell region's first substructure portion can also include a semiconductor channel portion that, when conductive, provides an electrical connection between one of the electrically conductive electrode portions and one of the electrically conductive line portions. The electrically conductive layer can be a patterned top electrode layer, and it can include two or more top electrode strips in a series, with adjacent top electrode strips being separated by more than a maximum width of the electrically conductive line portions.

The transport layer and leakage prevention techniques described above are advantageous because they make it possible to produce layered structures that include transport layers in advantageous configurations. For example, to simplify process flow and reduce complexity, an array's transport layer can be deposited by solution processing directly on semiconductive channel regions, whether the array's TFT channels include organic or amorphous silicon semiconductor material. The transport layer can also be between a top electrode layer and a layer that includes conductive lines, without significant loss of signal-to-noise ratio on the conductive lines. Unpatterned "blanket" transport layers can be used. These techniques are particularly applicable to light-interactive applications such as active matrix photosensing arrays, but could be applied in various other contexts.

The exemplary implementations described above are illustrated with specific shapes, dimensions, and other characteristics, but the scope of the invention includes various other shapes, dimensions, and characteristics. For example, the particular shapes of layer parts in a layered structure could be different, and could be of appropriate sizes for any particular array or other device. Furthermore, rather than being produced with the particular solution processing operations involving polymers as described above, transport layers in arrays and other devices as described above could be produced with various other solution processing operations. Also, leakage through a transport layer between top electrodes and conductive lines could similarly be prevented in devices with other layered structures with various other materials and characteristics.

Similarly, the exemplary implementations described above include specific examples of materials that can be solution processed, but any appropriate solution processable materials could be employed, including various polymers and polymer blends. Further, the above exemplary array implementations employ specific cell geometries, but a wide variety of other such geometries could be used within the scope of the invention. The invention is not limited to the specific examples of cell circuitry described above, but could be used with other cell circuitry that performs photosensing, other light interactions, or other operations. Furthermore, the solution processing techniques described above could be used to produce an incomplete structure, which could then be marketed for completion and inclusion in a finished product.

While the invention has been described in conjunction with specific exemplary implementations, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A layered structure comprising:
   a first substructure that has a patterned surface, the patterned surface including:
      one or more carrier-active surface parts, each on a respective electrically conductive electrode region; and
      one or more line surface parts, each on a respective electrically conductive line region that, in operation, carries electrical signals; and
   a second substructure over the patterned surface of the first substructure, the second substructure including:
      a transport layer on at least a set of the carrier-active surface parts; in operation, the transport layer transporting charge carriers in a thickness direction toward or away from the carrier-active surface parts in the set; and
      an electrically conductive layer over the transport layer;
   the layered structure including, over each of a set of the line surface parts, at least one of the following:
      an open region defined in the electrically conductive layer so that the electrically conductive layer does not extend substantially over the line surface part; and
      an electrically insulating layer portion covering the line surface part.

2. The structure of claim 1 in which the transport layer includes at least one of polymer material, blends of polymers, and polymerized organic compounds.

3. The structure of claim 2 in which the transport layer includes one or more of titanyl phthalocyanine; poly(vinylbutyral); poly(9,9-dioctylfluorene-alt-benzothiadiazole) (F8BT); N,N'-diphenyl-N,N'bis(3-methylphenyl)-(1-1'-biphenyl)-4,4'-diamine (TPD); and alkylated-4,-4'diphenoquinones (DPQ).

4. The structure of claim 2 in which the transport layer includes a dispersion of conductive organic polymer material in a binding matrix.

5. The structure of claim 1 in which the second substructure further includes:
   a generation layer in which free charge carriers are generated in response to light; the generation layer being between the transport layer and the electrically conductive layer over the transport layer.

6. A photosensing device comprising:
   a layered array structure that includes an array of two or more cell regions, the layered array structure including first and second substructures, each of a set of the cell regions in the array including a respective portion of each of the first and second substructures;
   each cell region's first substructure portion having a respective patterned surface; each cell region's patterned surface including:
      one or more carrier-active surface parts, each on a respective electrically conductive electrode portion of the cell region's first substructure portion, the electrode portion not extending outside the cell region; and
      one or more line surface parts, each on a respective electrically conductive line portion of the cell region's first substructure portion; the electrically conductive line portion being electrically connected to carry electrical signals between the cell region and circuitry outside the array;
   each cell region's second substructure portion being over the cell region's patterned surface and including:
      a transport layer portion that is on at least a set of the carrier-active surface parts and that, in operation, transports charge carriers in a thickness direction toward or away from the carrier-active surface parts in the set; and
      an electrically conductive layer portion over the transport layer portion;
   the layered array structure including, over each of a set of the line surface parts, at least one of the following:
      an open region defined in the electrically conductive layer portion so that the electrically conductive layer portion does not extend substantially over the line surface part; and
      an electrically insulating layer portion covering the line surface part.

7. The device of claim 6 in which the second substructure includes:
   a transport layer that covers the array and includes each cell region's transport layer portion; and
   an electrically conductive layer over the transport layer, the electrically conductive layer including each cell region's electrically conductive layer portion.

8. The device of claim 6 in which the electrically conductive layer is a patterned top electrode layer.

9. The device of claim 8 in which the patterned top electrode layer includes two or more top electrode strips in a series, with adjacent top electrode strips in the series separated by more than a maximum width of the electrically conductive line portions.

* * * * *